(12) United States Patent
Bergemont et al.

(10) Patent No.: US 6,177,315 B1
(45) Date of Patent: Jan. 23, 2001

(54) METHOD OF FABRICATING A HIGH DENSITY EEPROM ARRAY

(75) Inventors: Albert Bergemont, Palo Alto; Alexander Kalnitsky, San Franicisco, both of CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 09/321,702

(22) Filed: May 28, 1999

(51) Int. Cl.$^7$ ............................................... H01L 21/8247
(52) U.S. Cl. ........................... 438/258; 438/264; 438/279
(58) Field of Search ..................................... 438/257–267

(56) References Cited

U.S. PATENT DOCUMENTS

| | | | |
|---|---|---|---|
| 4,822,750 | * | 4/1989 | Perlegos et al. . |
| 5,324,677 | * | 6/1994 | Ishii . |
| 5,550,072 | * | 8/1996 | Cacharelis et al. . |
| 5,856,222 | * | 1/1999 | Bergemont et al. ................. 438/258 |
| 5,861,333 | * | 1/1999 | Lin ....................................... 438/258 |
| 5,910,016 | * | 6/1999 | Kazerounian et al. .............. 438/258 |
| 5,976,935 | * | 11/1999 | Lin et al. ............................. 438/264 |
| 6,083,791 | * | 7/2000 | Bergemont .......................... 438/258 |
| 6,087,211 | * | 7/2000 | Kalnitsky et al. ................... 438/232 |

* cited by examiner

*Primary Examiner*—Richard Booth
(74) *Attorney, Agent, or Firm*—Limbach & Limbach L.L.P.

(57) ABSTRACT

An EEPROM cell having a double-poly memory-transistor stacked-gate structure and a double-poly access-transistor stacked-gate structure is formed in a process that utilizes a thick layer of oxide as an etch stop when the layers of material are etched to form the memory-transistor stacked-gate structure and the access-transistor stacked-gate structure.

15 Claims, 19 Drawing Sheets

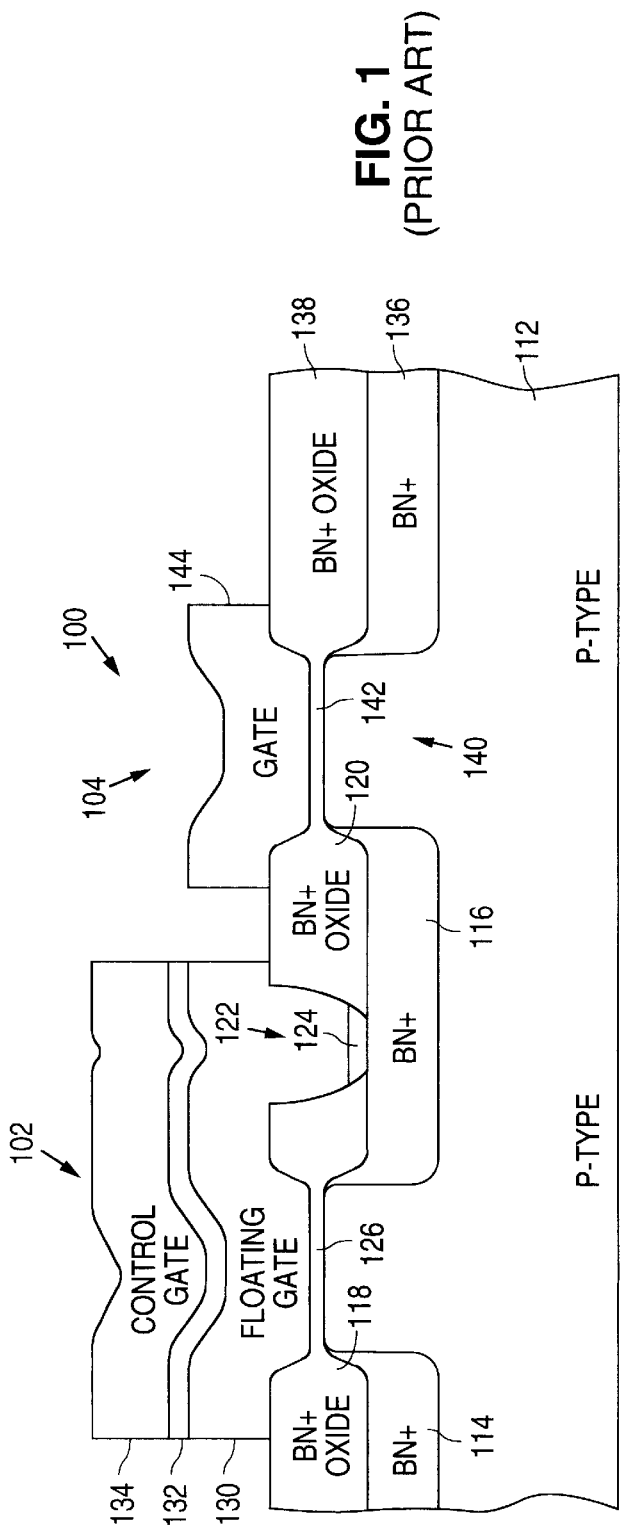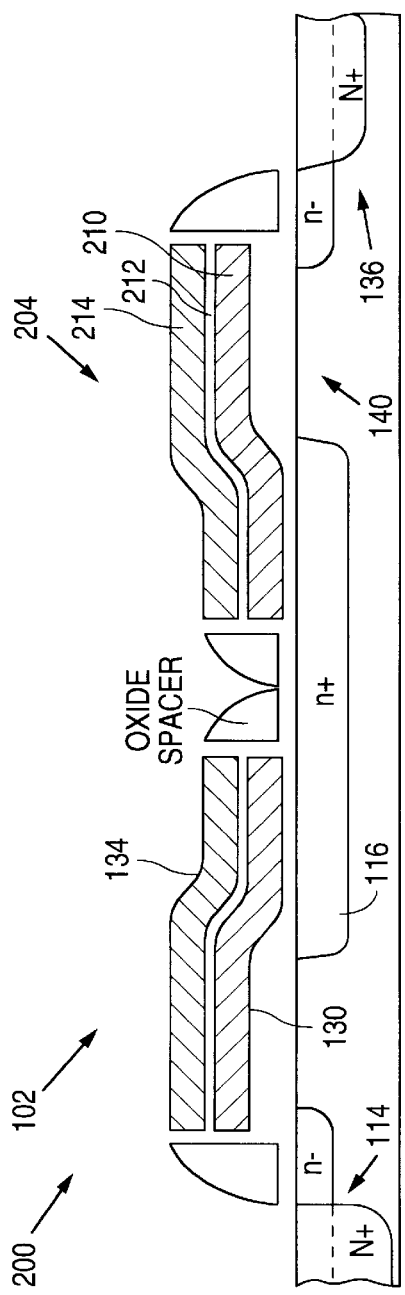
FIG. 1 (PRIOR ART)
FIG. 2 (PRIOR ART)

METHOD OF FABRICATING A HIGH DENSITY EEPROM ARRAY

BACKGROUND OF THE INVENTION

1. Field of the Invention

The present invention relates to high-density electrically-erasable, programmable, read-only-memory (EEPROM) devices and, in particular, to a method of fabricating a high-density EEPROM array.

2. Discussion of the Related Art

A floating-gate tunneling-oxide (FLOTOX) electrically-erasable programmable read-only-memory (EEPROM) cell is an information storage device that utilizes the non-volatile storage of an electric charge as the information storage mechanism. FLOTOX EEPROM cells differ from EPROM and flash non-volatile memory cells in that FLOTOX EEPROM cells are both programmed and erased by means of Fowler-Nordheim tunneling.

FIG. 1 shows a cross-sectional diagram that illustrates a conventional FLOTOX EEPROM cell 100. As shown in FIG. 1, EEPROM cell 100 includes a memory transistor 102 which holds the electric charge, and an access transistor 104 which controls access to memory transistor 102.

Memory transistor 102 includes buried N+(BN+) source and drain regions 114 and 116, respectively, which are formed in a lightly-doped p-type substrate 112, and BN+ oxide regions 118 and 120 which are grown over BN+ source and drain regions 114 and 116, respectively. BN+ oxide region 120, in turn, includes a tunnel window 122 that exposes a portion of drain region 116.

As further shown in FIG. 1, memory transistor 102 also includes a thin layer of tunnel oxide 124 that is formed over drain region 116 in tunnel window 122, and a thicker layer of gate oxide 126 that is formed over substrate 112 between BN+ source and drain regions 114 and 116.

In addition, memory transistor 102 further includes a floating gate 130 which is formed over BN+ oxide regions 118 and 120, tunnel oxide layer 124, and gate oxide layer 126, and a control gate 134 which is formed over floating gate 130 and isolated therefrom by a layer of interpoly dielectric 132.

Access transistor 104, in turn, includes a drain region 136 which is formed in substrate 112, a BN+oxide region 138 which is grown over BN+ drain region 136, and a channel region 140 which is defined between drain region 136 and drain region 116 (which acts as the source for access transistor 104). Further, transistor 104 also includes a layer of gate oxide 142 which is formed on substrate 112 over channel region 140, and an access gate 144 which is formed on gate oxide layer 142 over channel region 140.

In operation, cell 100 is programmed by applying a program voltage, such as +12V, to control gate 134 and an access voltage, such as +5V, to access gate 144 while grounding drain region 136 and floating source region 114. Under these bias conditions, electrons from drain region 116 tunnel through tunnel oxide layer 124 by way of the well-known Fowler-Nordheim tunneling mechanism, and begin accumulating on floating gate 130 where the increased negative charge raises the threshold voltage of the cell.

Cell 100 is erased by applying the access voltage to access gate 144 and an erase voltage, such as +12V, to drain region 136 while grounding control gate 134 and floating source region 114. Under these bias conditions, electrons from floating gate 130 tunnel back through tunnel oxide layer 124 to drain region 116 where the reduced negative charge on floating gate 130 lowers the threshold voltage of the cell. (The thickness of gate oxide layer 126 and the magnitudes of the program and erase voltages are selected so that Fowler-Nordheim tunneling does not occur through gate oxide layer 126.)

Once programmed or erased, cell 100 is read by applying a first read voltage, such as +1.5V, to control gate 134, the access voltage to access gate 144, and a second read voltage, such as +3V, to drain region 136 while grounding source region 114. When cell 100 is erased, a large current flows from drain region 136 to drain region 116 to source region 114 due to the lower threshold voltage of an erased cell, while a much smaller current or no current at all flows from drain region 136 to drain region 116 to source region 114 when cell 100 is programmed due to the higher threshold voltage of a programmed cell.

U.S. Pat. No. 5,856,222 to Bergemont et al. disclosed a FLOTOX EEPROM cell and a method of fabricating the cell that utilized a floating-gate access transistor. FIG. 2 shows a cross-sectional diagram that illustrates an EPROM cell 200 as disclosed by Bergemont. Cell 200 is similar to cell 100 and, as a result, utilizes the same reference numerals to designate the structures which are common to both cells.

As shown in FIG. 2, one way that cell 200 differs from cell 100 is that cell 200 utilizes a double-poly access transistor 204. Specifically, access transistor 204 includes a floating gate 210 which is formed over channel region 140, a layer of interpoly dielectric 212 which is formed on floating gate 210, and a control gate 214 which is formed on dielectric layer 212.

FIGS. 3A–3E show a series of cross-sectional views that illustrate a process flow for fabricating EEPROM cell 200. As shown in FIG. 3A, the process begins by forming a layer of oxide 312 approximately 500 Å thick on a conventionally formed p-type substrate material 310, such as a well or a substrate.

Following this, a mask 314 is formed and patterned on oxide layer 312 to expose a region on the surface of oxide layer 312. The exposed region is then implanted with an n-type dopant to form a buried n+ region 316 in material 310. Following the implant, mask 314 is removed.

As shown in FIG. 3B, after mask 314 has been removed, the exposed region of oxide layer 312 is etched away to form an exposed region on the surface of material 310. Next, a layer of tunnel oxide 320 approximately 70 Å thick is formed on the exposed region of material 310.

As shown in FIG. 3C, once tunnel oxide layer 320 has been formed, a layer of first polysilicon (poly-1) 322 is formed on oxide layer 312 and tunnel oxide layer 320. The layer of poly-1 322 is then conventionally doped. A layer of interpoly dielectric material 324 is formed on poly-1 layer 322. Dielectric layer 324 is typically implemented with oxide/nitride/oxide (ONO).

Following this, a layer of second polysilicon (poly-2) 326 is deposited on ONO layer 324. After poly-2 layer 326 has been formed, a mask 330 is formed and patterned on poly-2 layer 326. The unmasked regions of poly-2 layer 326, and the underlying layers of ONO and poly-1 are then etched.

The etch forms a memory-transistor stacked-gate structure 332, an access-transistor stacked-gate structure 334, a pair of exposed regions 336 on the surface of oxide layer 312, and an exposed region 338 on the surface of tunnel oxide layer 320.

Poly-1 layers 322 in structures 332 and 334 form floating gates 130 and 210, respectively, while poly-2 layers 326 in structures 332 and 334 form control gates 134 and 214, respectively, which are self-aligned to the floating gates 130 and 210. Following the etch, mask 330 is removed.

As shown in FIG. 3D, once mask 330 has been removed, the exposed regions 336 and 338 are then implanted with an n-type dopant to form a lightly-doped source region 340A and a lightly-doped drain region 342A in material 310. (The implant also increases the dopant concentration of region 316.)

Next, a layer of oxide (not shown) is then formed on oxide layer 312, tunnel oxide layer 320, and structures 332 and 334, and then anisotropically etched to form spacers 344 adjacent to the sidewalls of structures 332 and 334.

As shown in FIG. 3E, spacers 344 reduce the size of the exposed regions formed over the source and drain regions 340A and 342A. The reduced-size exposed regions are then implanted to form heavily-doped source and drain regions 340B and 342B.

One of the problems with the above-described process flow, as shown in FIG. 3C, is that it is difficult to etch poly-2 layer 326, and the underlying layers of ONO and poly-1 during the step that forms structures 332 and 334 without undesirably etching the thin layer of tunnel oxide 320.

Another problem with the above-described process flow is that access transistor 204 is weak and suffers from a low punchthrough voltage. One way to increase the punchthrough voltage is to increase the length of transistor 204. Increasing the length of transistor 204, however, adversely affects the cell size. Thus, there is a need for a modified process that eliminates the above-noted problems.

SUMMARY OF THE INVENTION

The present invention provides a method for forming an EEPROM cell and an EEPROM cell array that forms a self-aligned memory-transistor stacked-gate structure and a self-aligned access-transistor stacked-gate structure without etching the thin layer of tunnel oxide.

The method of the present invention begins with a semiconductor material of a first conductivity type. After this, a layer of isolation material, which has a first thickness, is formed on the semiconductor material. Next, a mask is formed on the layer of isolation material that defines a first area on the surface of the semiconductor material.

The layer of isolation material formed over the first area is removed to form an exposed area on the surface of the semiconductor material. A dopant of a second conductivity type is introduced through the first area to form a first region in the semiconductor material.

Following the above, a layer of tunnel oxide is formed on the exposed area. The layer of tunnel oxide has a second thickness that is less than the first thickness. After the layer of tunnel oxide has been formed, a first layer of polysilicon (poly-1) is formed on the layer of isolation material and the layer of tunnel oxide.

Next, the layer of poly-1 is selectively etched to form a poly-1 region on the surface of the layer of isolation material over the first region. After this, a layer of dielectric material is formed on the poly-1 region, followed by the formation of a second layer of polysilicon (poly-2) on the layer of dielectric material.

The poly-2 layer, and underlying layers of dielectric material and the poly-1 layer are selectively removed to form a memory-transistor stacked-gate structure and an access-transistor stacked-gate structure, and to expose a first implant area on the layer of isolation material between the memory transistor stacked-gate structure and the access transistor stacked-gate structure, a second implant area on the layer of isolation material that is spaced apart from the first implant area and adjacent to the memory-transistor stacked-gate structure, and a third implant area on the layer of isolation material that is spaced apart from the first and second implant areas and adjacent to the access-transistor stacked-gate structure.

After this, a dopant of the second conductivity type is introduced into the semiconductor material through the first, second, and third implant areas to form a second region between the memory-transistor stacked-gate structure and the access-transistor stacked-gate structure, a source region adjacent to the memory-transistor stacked-gate structure, and a drain region adjacent to the access-transistor stacked-gate structure.

Following this, the dopants are driven in to laterally diffuse the dopants so that the first and second regions contact each other.

The present invention also includes a method of forming a plurality of EEPROM cells in a semiconductor material of a first conductivity type. The method begins by forming a layer of isolation material having a first thickness on the semiconductor material. Next, a mask is formed that defines a plurality of first areas on the surface of the semiconductor material.

The layer of isolation material formed over the first areas is removed to form a plurality of exposed areas on the surface of the semiconductor material. A dopant of a second conductivity type is introduced through the first areas to form a plurality of first regions in the semiconductor material. The first regions are arranged in rows and columns.

After the above has been completed, a layer of tunnel oxide is formed on each of the exposed areas. The layer of tunnel oxide has a second thickness that is less than the first thickness. Next, a first layer of polysilicon (poly-1) is formed on the layer of isolation material and the layer of tunnel oxide formed on each of the exposed areas.

Following this, the layer of poly-1 is selectively etched to form a plurality of poly-1 strips on the surface of the layer of isolation material. Each poly-1 strip, in turn, is formed over a column of first regions.

Next, a layer of dielectric material is formed on the poly-1 strips, followed by the formation of a second layer of polysilicon (poly-2) on the layer of dielectric material. After this, the poly-2 layer, and the underlying layer of dielectric material, and poly-1 strips are selectively removed to form: (1) rows and columns of memory-transistor stacked-gate structures that are each formed over a first region, and have a floating gate and a control gate; (2) a plurality of word lines that are formed so that each word line is connected to each control gate in a row of structures; (3) rows and columns of access-transistor stacked-gate structures that each have a floating gate and a control gate; (4) a plurality of access lines that are formed so that each access line is connected to each control gate of each access-transistor stacked-gate structure in a row of access-transistor stacked-gate structures; and (5) a plurality of exposed strips and a plurality of exposed regions on the surface of the layer of isolation material.

Each exposed strip is substantially parallel to the word and access lines and formed along and between a pair of adjacent rows of memory-transistor stacked-gate structures. The exposed regions, in turn, are formed so that an exposed region is formed between each adjacent pair of access-transistor stacked-gate structures in each column of access structures, and between each memory-transistor stacked-gate structure and each access-transistor stacked-gate structure in each column of memory and access structures.

A better understanding of the features and advantages of the present invention will be obtained by reference to the following detailed description and accompanying drawings which set forth an illustrative embodiment in which the principles of the invention are utilized.

DESCRIPTION OF THE DRAWINGS

FIG. 1 is a cross-sectional diagram illustrating a conventional FLOTOX EEPROM cell 100.

FIG. 2 is a cross-sectional diagram illustrating an EPROM cell 200 as disclosed by Bergemont.

FIGS. 4A–9A are a series of plan views illustrating a process flow for fabricating an EEPROM array 400 in accordance with the present invention.

FIGS. 4B–9B are a series of cross-sectional views taken along lines 4B–9B, respectively, of FIGS. 4A–9A.

FIGS. 4C–9C are a series of cross-sectional views taken along lines 4C–9C, respectively, of FIGS. 4A–9A.

FIGS. 10A–13A are a series of plan views illustrating a process flow for fabricating an EEPROM array 1000 in accordance with the first alternate embodiment of the present invention.

FIGS. 10B–13B are a series of cross-sectional views taken along lines 10B–13B, respectively, of FIGS. 10A–13A.

FIGS. 10C–13C are a series of cross-sectional views taken along lines 10C–13C, respectively, of FIGS. 10A–13A.

FIGS. 14A–19A show a series of plan views illustrating a process flow for fabricating an EEPROM array 1400 in accordance with the second alternate embodiment of the present invention.

FIGS. 14B–19B are a series of cross-sectional views taken along lines 14B–19B, respectively, of FIGS. 14A–19A.

FIGS. 14C–19C are a series of cross-sectional views taken along lines 14C–19C, respectively, of FIGS. 14A–19A.

DETAILED DESCRIPTION

FIGS. 4A–9A show a series of plan views that illustrate a process flow for fabricating an EEPROM array 400 in accordance with the present invention. FIGS. 4B–9B show a series of cross-sectional views taken along lines 4B–9B, respectively, of FIGS. 4A–9A. FIGS. 4C–9C show a series of cross-sectional views taken along lines 4C–9C, respectively, of FIGS. 4A–9A.

Figure 4A:
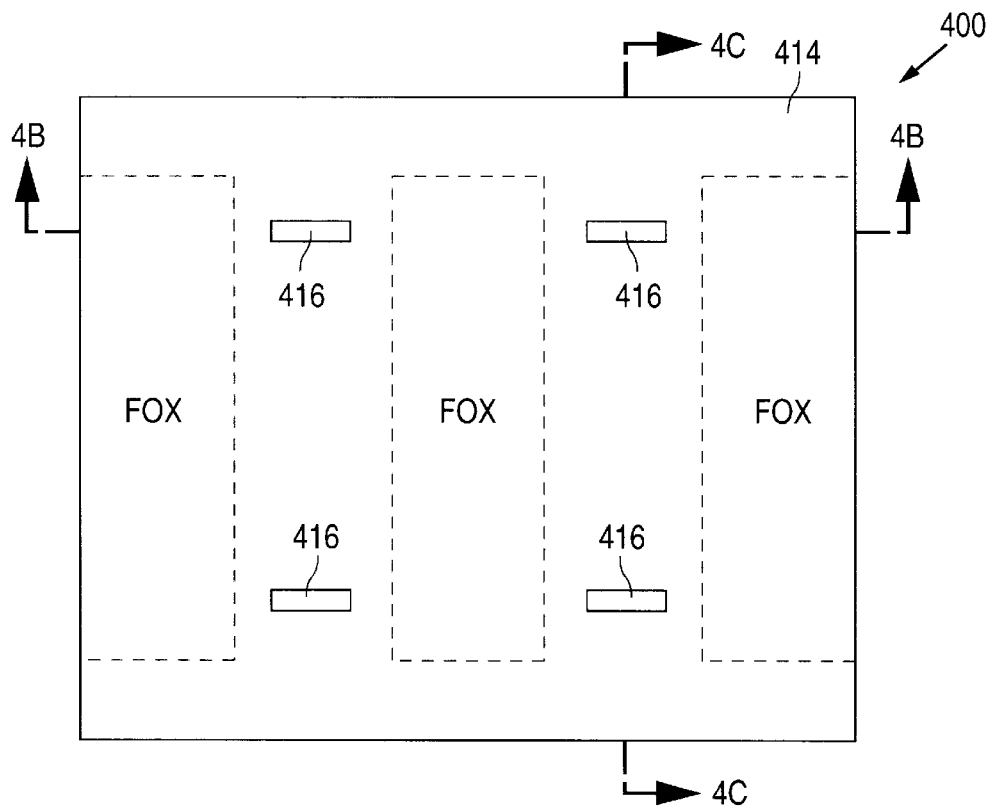
Figure 4B:
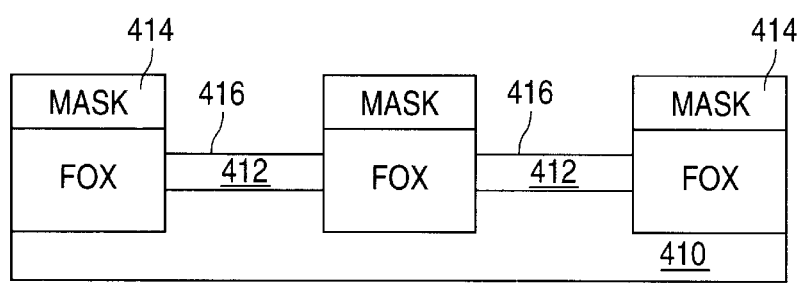
Figure 4C:
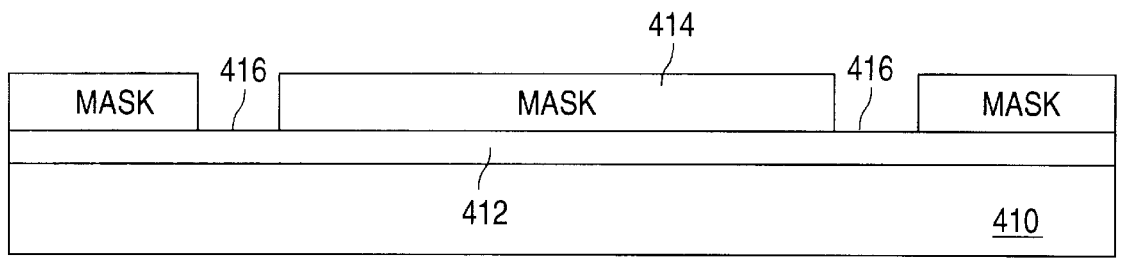

As shown in FIGS. 4A–4C, the process of the present invention begins with a conventionally formed wafer which has a p-type semiconductor material 410, such as a well or a substrate, and a number of spaced-apart field oxide regions FOX which are formed in material 410. Field oxide regions FOX can be implemented with LOCOS, trench, or other well known isolation structures.

From this point, a layer of oxide 412 approximately 300–500 Å thick is formed on material 410, followed by the formation of an overlying mask 414. Mask 414 is then patterned to expose a plurality of regions 416 on the surface of oxide layer 412.

Figure 5A:
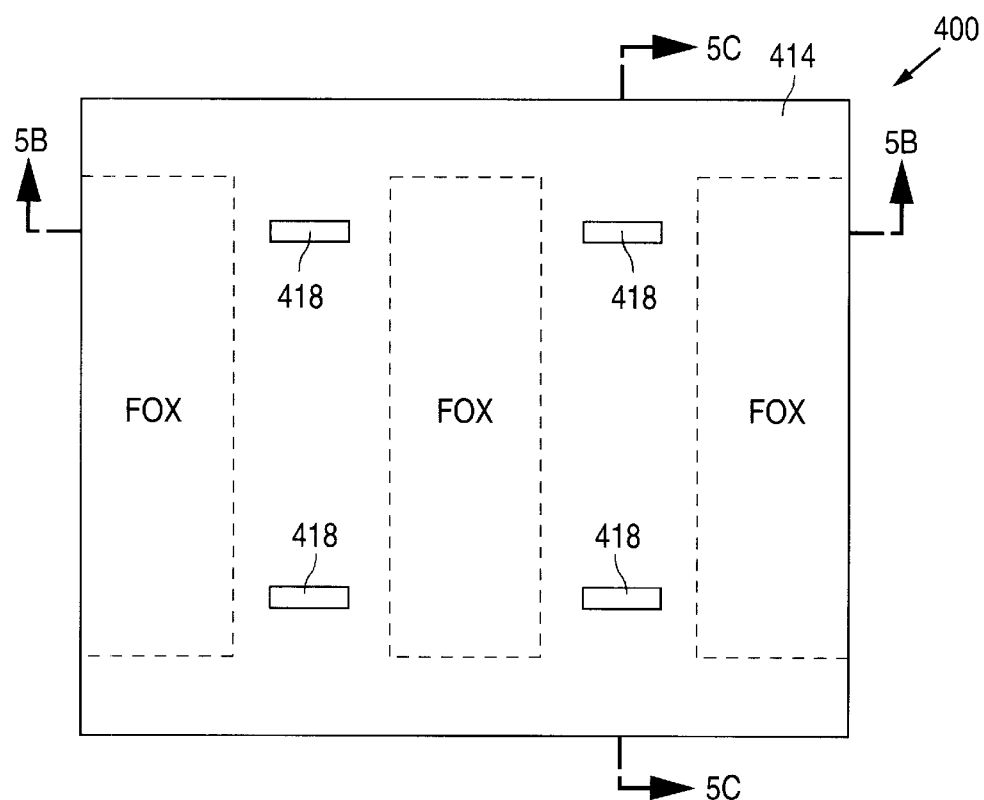
Figure 5B:
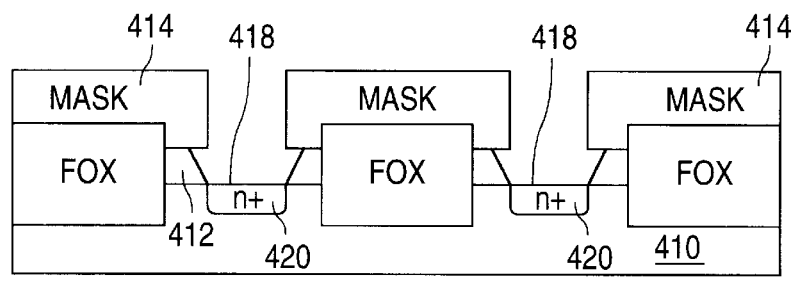
Figure 5C:
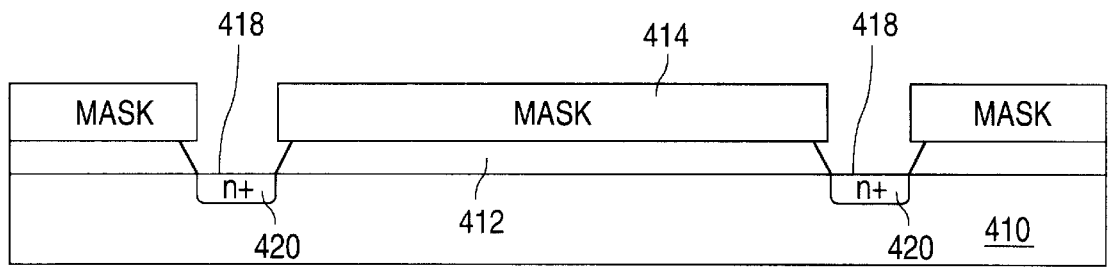

As shown in FIGS. 5A–5C, the exposed regions 416 of oxide layer 412 are then etched away (by an oxide dip) to expose a plurality of regions 418 on the surface of material 410. After this, the exposed regions 418 are implanted with an n-type dopant to form a plurality of buried n+ regions 420 in material 410.

Following the implant, mask 414 is removed. After this, the exposed regions 418 on the surface of material 410 are cleaned. (Alternately, material 410 can be implanted to form n+ regions 420 prior to the removal of the exposed regions 416 of oxide layer 412.)

Figure 6A:
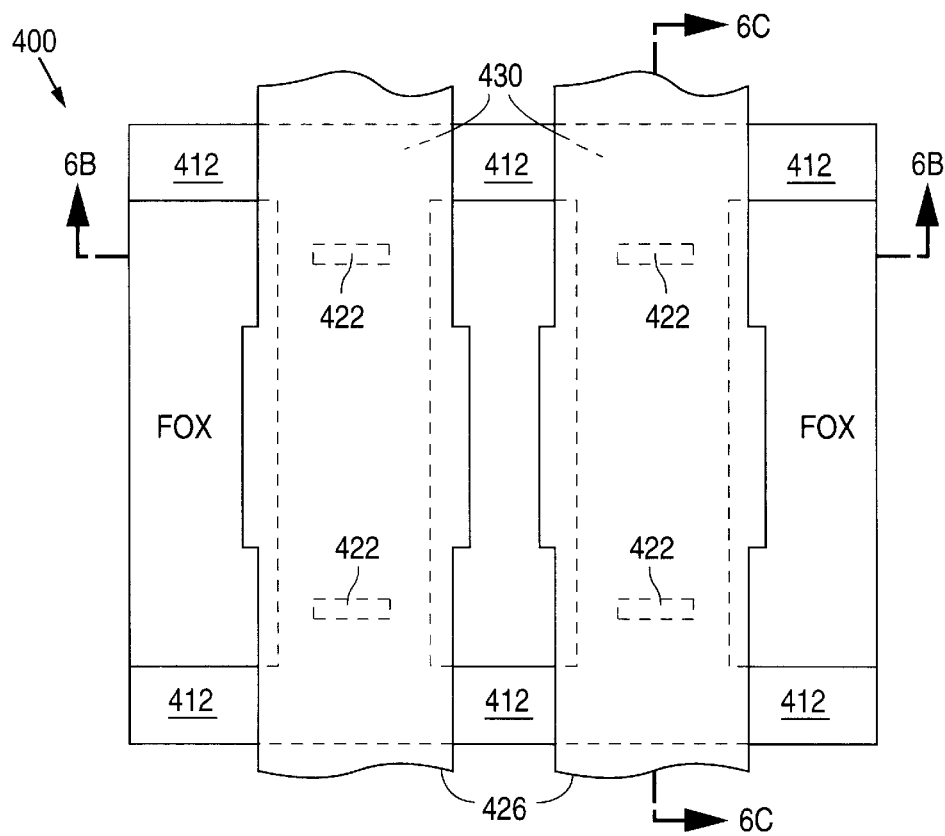
Figure 6B:
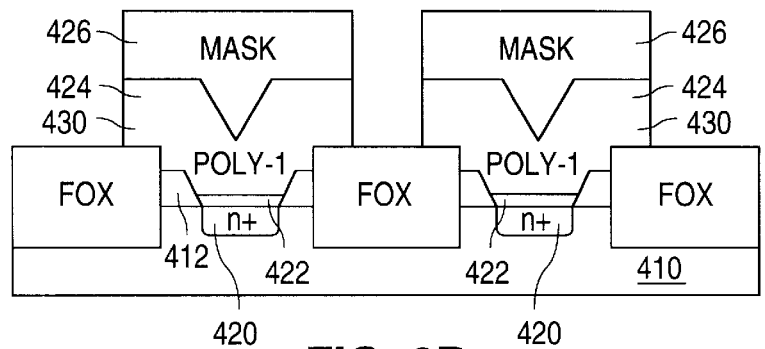
Figure 6C:
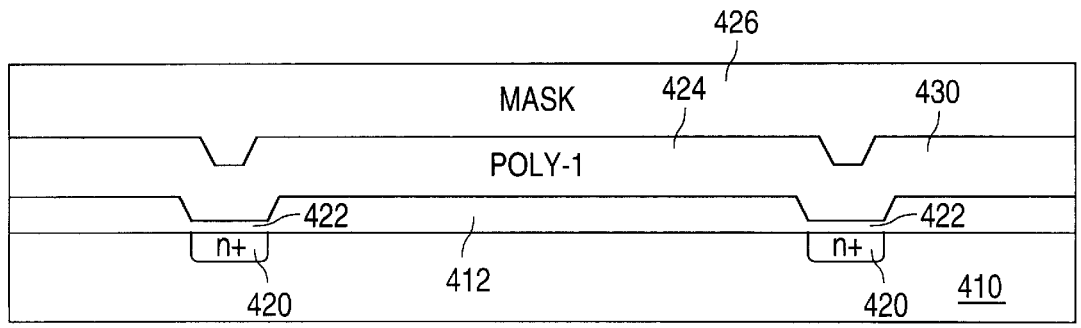

As shown in FIGS. 6A–6C, after the exposed regions 418 have been cleaned, a layer of tunnel oxide 422 approximately 70–80 Å thick is formed on the exposed regions 418 of material 410. Once tunnel oxide layer 422 has been formed, a layer of first polysilicon (poly-1) 424 is formed on oxide layer 412, tunnel oxide layer 422, and the field oxide regions FOX. The layer of poly-1 424 is then conventionally doped.

After this, a mask 426 is formed and patterned on poly-1 layer 424. The unmasked areas of poly-1 layer 424 are then etched away to form a series of spaced-apart poly-1 strips 430. Once the strips 430 have been formed, mask 426 is removed.

Figure 7A:
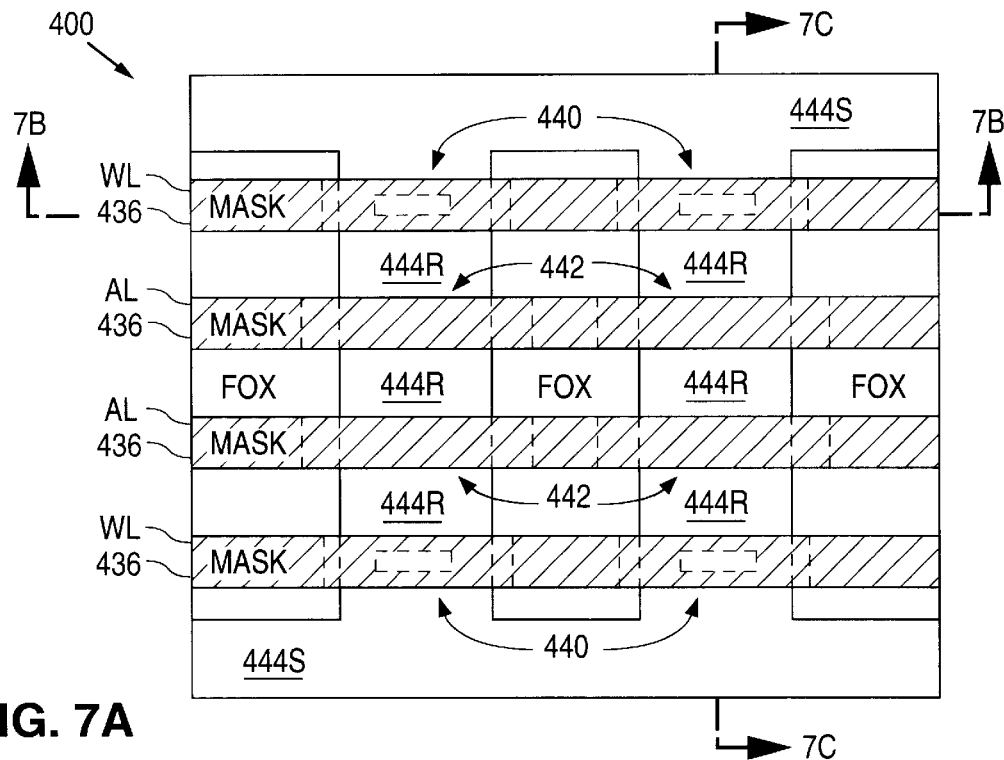
Figure 7B:
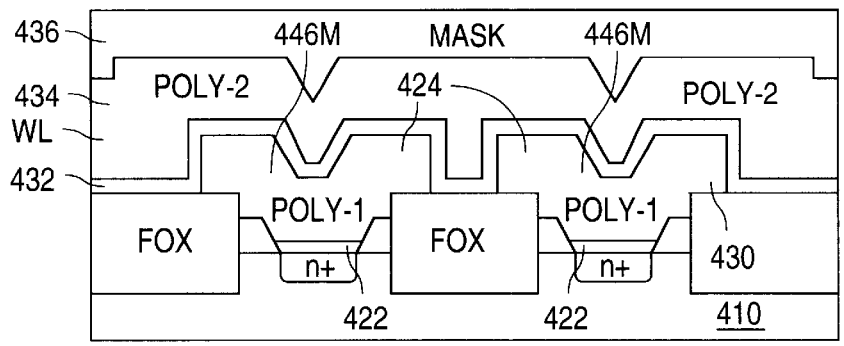
Figure 7C:
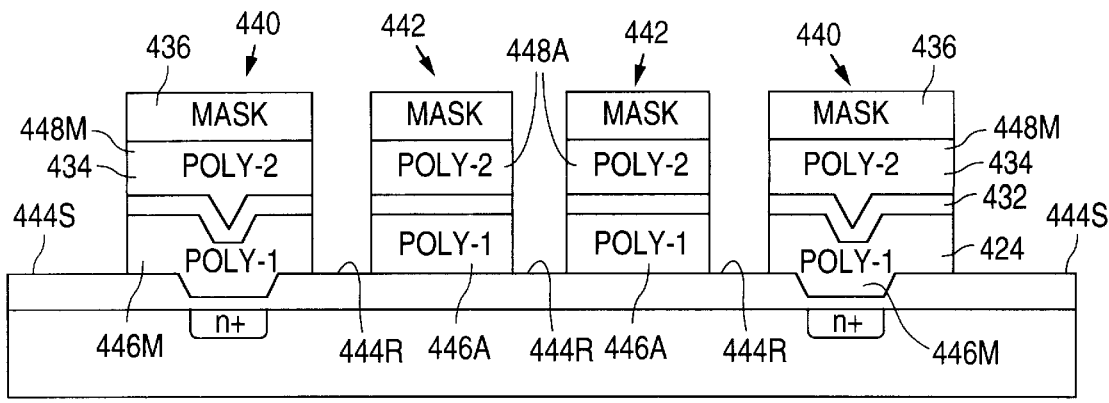

Next, as shown in FIGS. 7A–7C, a layer of interpoly dielectric material 432 is formed on poly-1 layer 424, the exposed regions of oxide layer 412, and the field oxide regions FOX. Dielectric layer 432 can be implemented with layers of oxide, nitride, and oxide (ONO).

Following this, a layer of second polysilicon (poly-2) 434 is deposited on ONO layer 432. After poly-2 layer 434 has been formed, a mask 436 is formed and patterned on poly-2 layer 434. The unmasked regions of poly-2 layer 434, and the layer of ONO 432 and the poly-1 strips 430 formed under the unmasked regions of poly-2 layer 434 are then etched away.

The etch forms rows and columns of memory-transistor stacked-gate structures 440 that each have a floating gate 446M and a control gate 448M, and a series of word lines WL that are formed so that each word line WL is connected to each control gate 448M in a row of structures 440.

The etch also forms rows and columns of access-transistor stacked-gate structures 442 that each have a floating gate 446A and a control gate 448A, and a series of access lines AL that are formed so that each access line AL is connected to each control gate 448A in a row of structures 442. Thus, poly-1 layer 424 forms floating gates 446M and 446A in structures 440 and 442, respectively, while poly-2 layer 434 forms control gates 448M and 448A in structures 440 and 442, respectively.

As further shown in FIGS. 7A–7C, access-transistor stacked-gate structures 442 are formed in the same column as memory-transistor stacked-gate structures 440, but in different rows than memory-transistor stacked-gate structures 440.

The etch additionally forms both a plurality of exposed strips 444S and a plurality of exposed regions 444R on the surface of oxide layer 412. As shown, each exposed strip 444S, which is substantially parallel to the word and access lines WL and AL, is formed along and between a pair of adjacent rows of memory-transistor stacked-gate structures 440.

In addition, the exposed regions 444R are formed so that an exposed region 444R is formed between each adjacent pair of access-transistor stacked-gate structures 442 in each column of access structures, and between each memory-transistor stacked-gate structure 440 and each access-transistor stacked-gate structure 442 in each column of memory and access structures 440 and 442. Following the etch, mask 436 is removed.

Figure 3A:
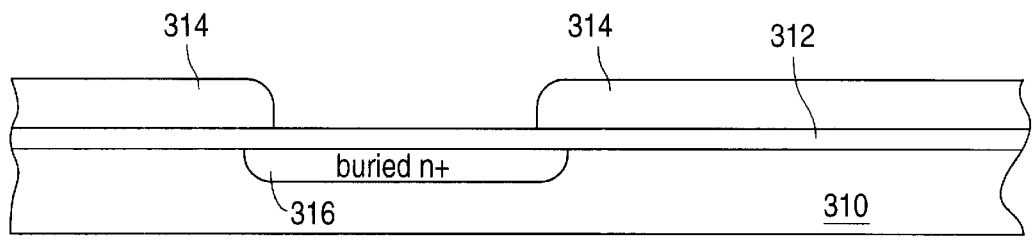
FIGS. 3A–3E are a series of cross-sectional views illustrating a process flow for fabricating EEPROM cell 200.
Figure 3B:
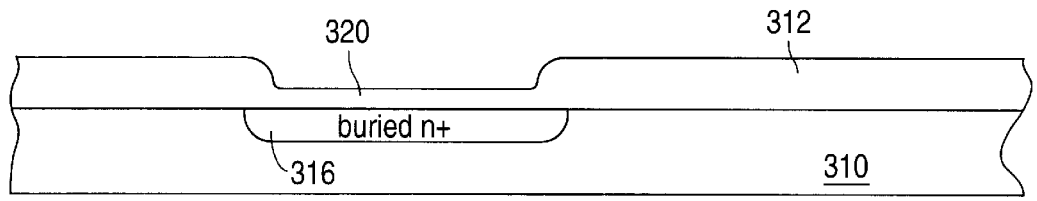
Figure 3C:
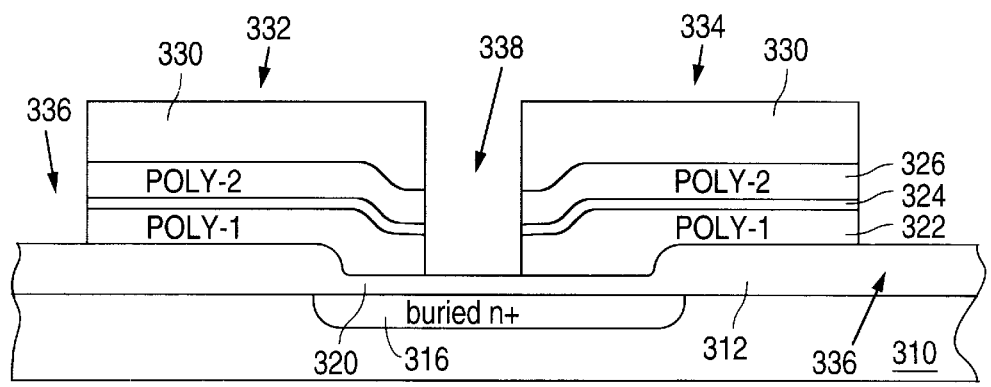
Figure 3D:
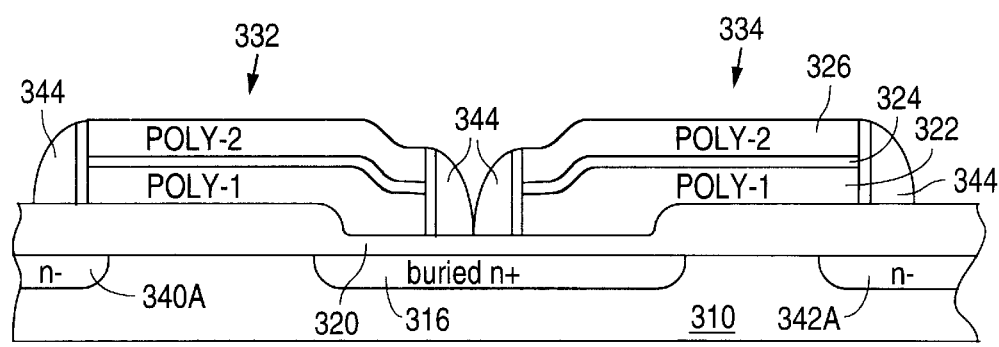
Figure 3E:
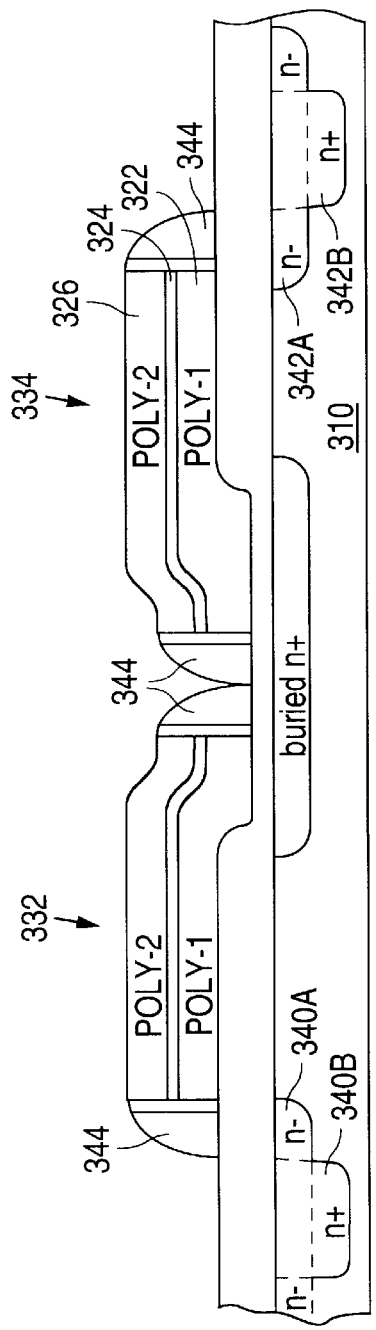

One of the advantages of the present method is that, as shown in FIG. 7C, the etch that forms structures 440 and 442 stops on thick oxide layer 412 rather than the thin tunnel oxide layer as was the case in the prior art (see FIG. 3C).

Figure 8A:
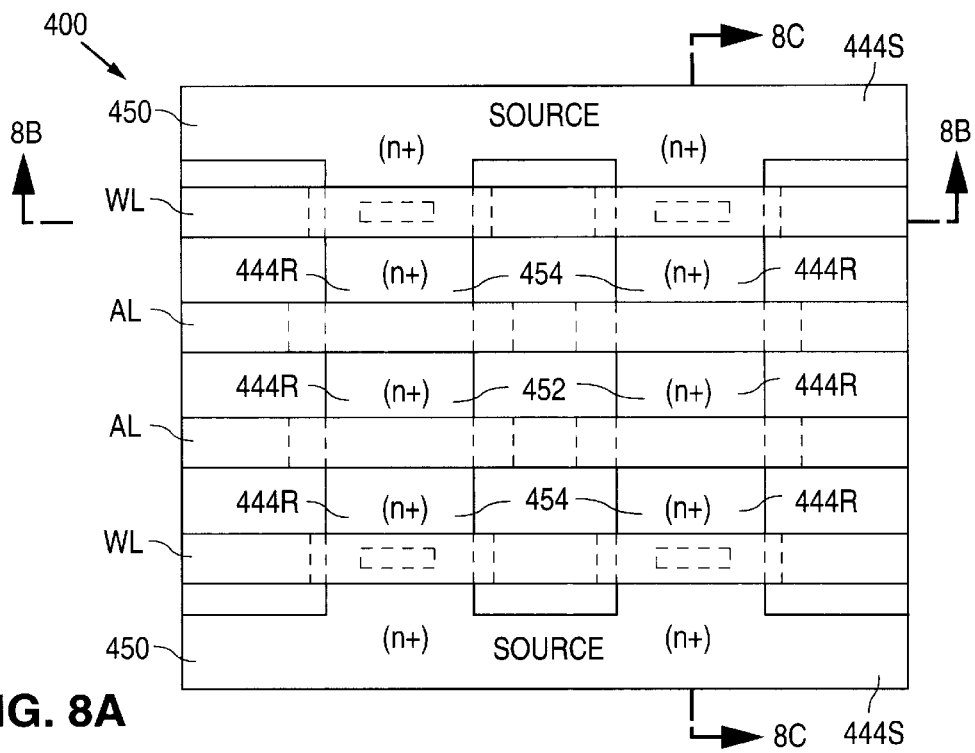
Figure 8B:
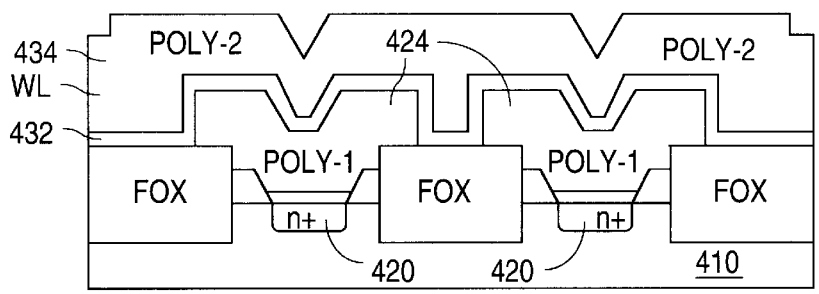
Figure 8C:
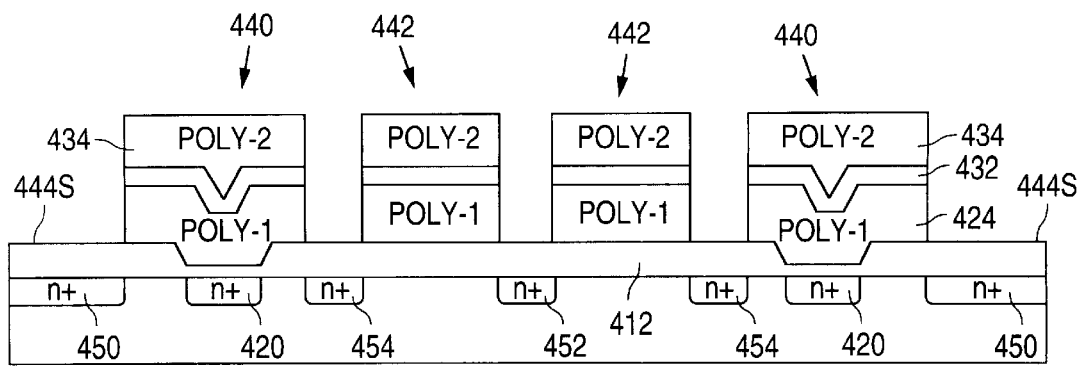

As shown in FIGS. 8A–8C, once mask 436 has been removed, the exposed strips and regions 444S and 444R are implanted with an n-type dopant to form heavily-doped source regions 450, heavily-doped drain regions 452, and heavily-doped buried regions 454 in material 410. The implant also dopes the word and access lines WL and AL (including poly-2 control gates 448M and 448A).

Figure 9A:
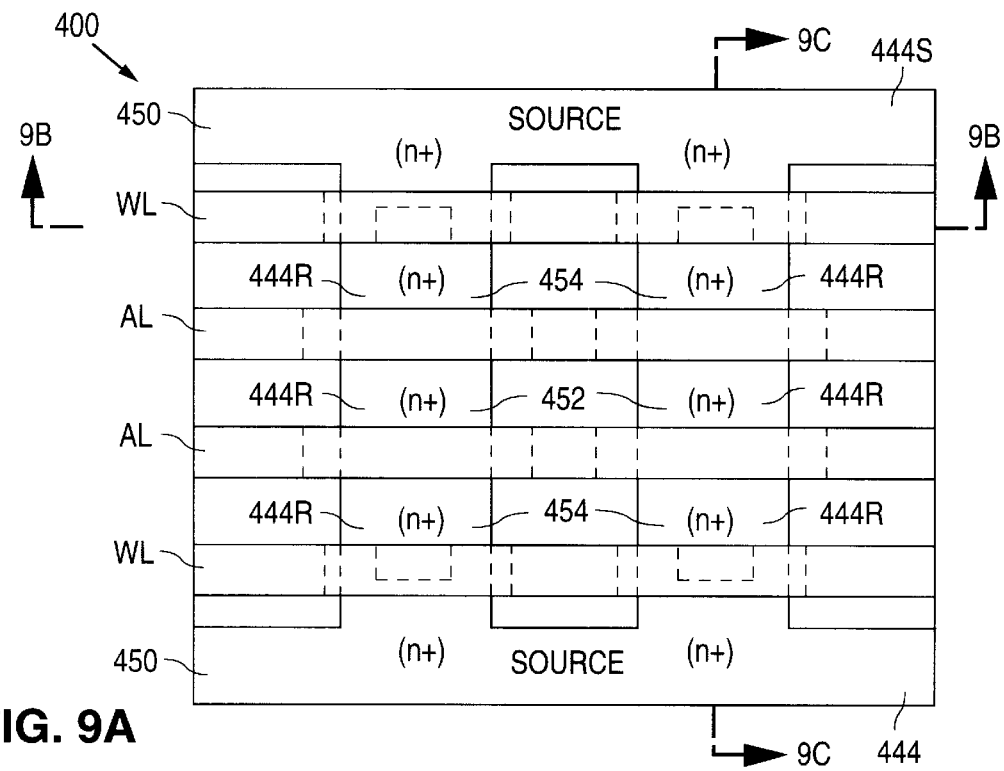
Figure 9B:
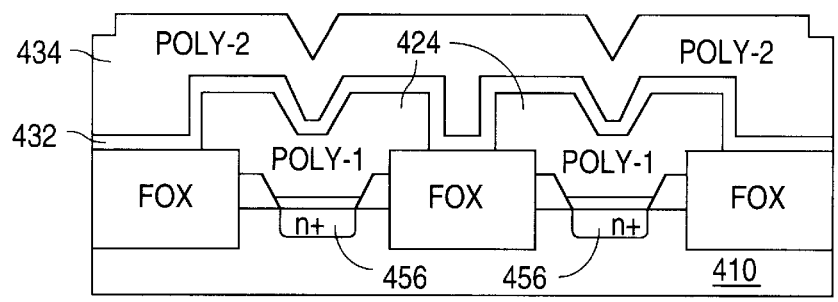
Figure 9C:
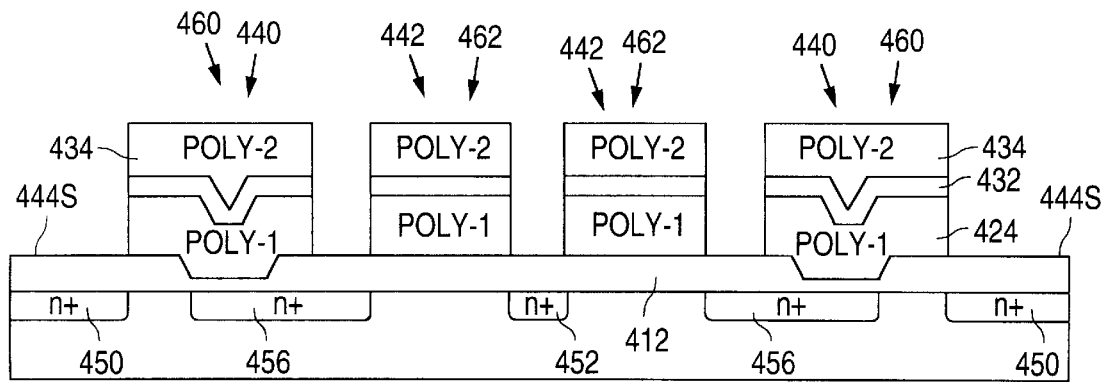

Next, as shown in FIGS. 9A–9C, the implants are driven in until the lateral diffusions of the adjoining pairs of n+ regions 420 and 454 have overlapped each other by a sufficient amount to provide a single n+ region 456.

Following the formation of region 456, conventional steps are then used to form metal traces which are connected to heavily-doped source regions 450, heavily-doped drain regions 452, word lines WL, and access lines AL, and to further complete the array.

Thus, a method for forming a memory cell having a memory transistor 460 and an access transistor 462 is provided where memory transistor 460 is formed from structure 440, source region 450, and buried region 456, and access transistor 462 is formed from structure 442, buried region 456, and drain region 452.

When array 400 is embedded in a low sub-micron CMOS circuit, the drive-in step that conventionally follows the LDD implantation step used in the formation of CMOS transistors is often sufficient to form region 456. In those cases where the LDD drive-in step is insufficient, the drive-in step must be at least partially completed prior to the LDD implant.

In a first alternate embodiment, the dopant concentrations in source regions 450 and buried regions 454 are increased by implanting these regions twice. FIGS. 10A–13A show a series of plan views that illustrate a process flow for fabricating an EEPROM array 1000 in accordance with the first alternate embodiment of the present invention.

FIGS. 10B–13B show a series of cross-sectional views taken along lines 10B–13B, respectively, of FIGS. 10A–13A. FIGS. 10C–13C show a series of cross-sectional views taken along lines 10C–13C, respectively, of FIGS. 10A–13A.

Array 1000 is formed by a process that is similar to the process for forming array 400 and, as a result, utilizes the same reference numerals to refer to the structures which are common to both processes.

Figure 10A:
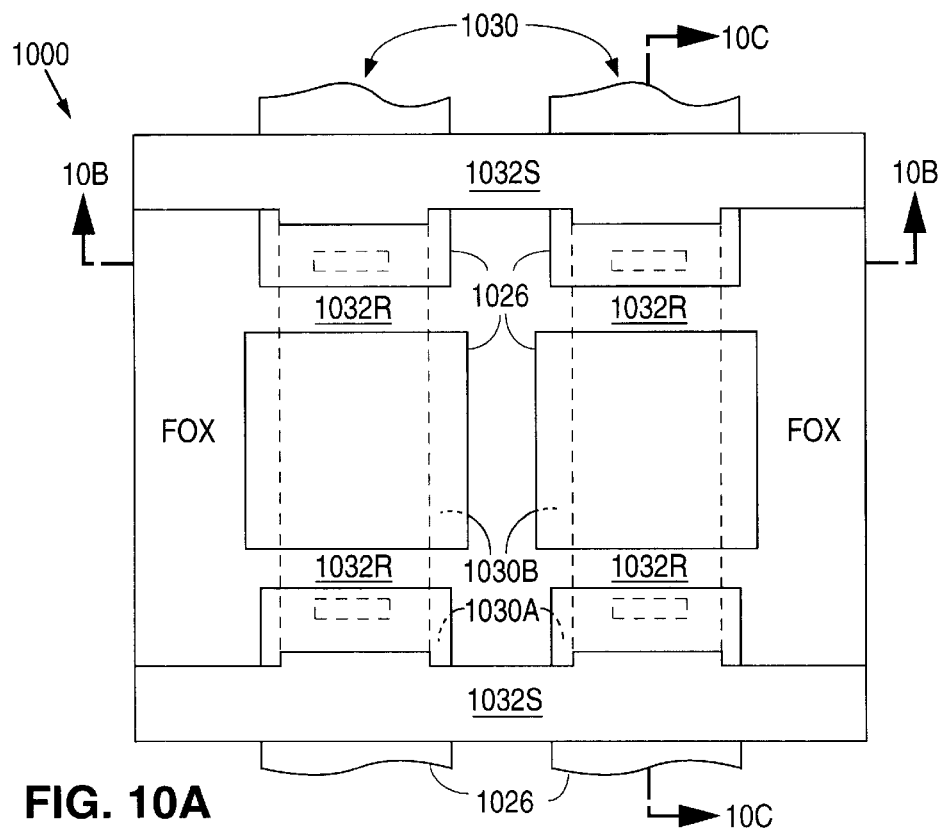
Figure 10B:
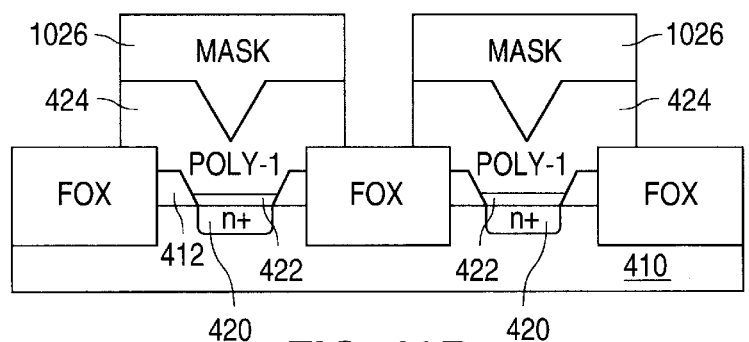
Figure 10C:
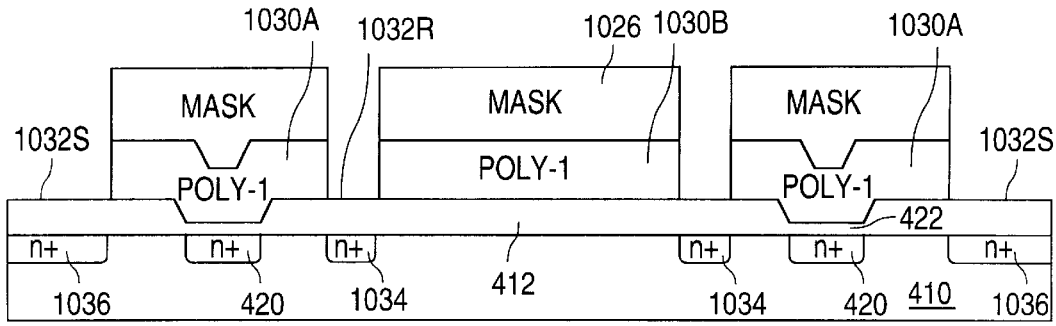

The process for forming array 1000 begins the same as the process for forming array 400 and, as shown in FIGS. 10A–10C, first diverges by forming a mask 1026 on poly-1 layer 424 which is a modified version of mask 426.

The unmasked areas of poly-1 layer 424 are then etched away to form rows and columns of first poly-1 regions 1030A and second poly-1 regions 1030B such that a second poly-1 region 1030B is formed between every other pair of first poly-1 regions 1030A in each column of poly-1 and poly-2 regions 1030A and 1030B.

The etch additionally forms a plurality of exposed strips 1032S and a plurality of exposed regions 1032R on the surface of oxide layer 412. As shown, each exposed strip 1032S is formed along and between every other pair of adjacent rows of first poly-1 regions 1030A.

In addition, the plurality of exposed regions 1032R are formed so that an exposed region 1032R is formed between each adjacent pair of first and second poly-1 regions 1030A and 1030B in each column of poly-1 and poly-2 regions 1030A and 1030B. The exposed strips and regions 1032S and 1032R are then implanted with a n-type material to form initial buried regions 1034 and initial source regions 1036. Once the implant has been completed, mask 1026 is removed.

Figure 11A:
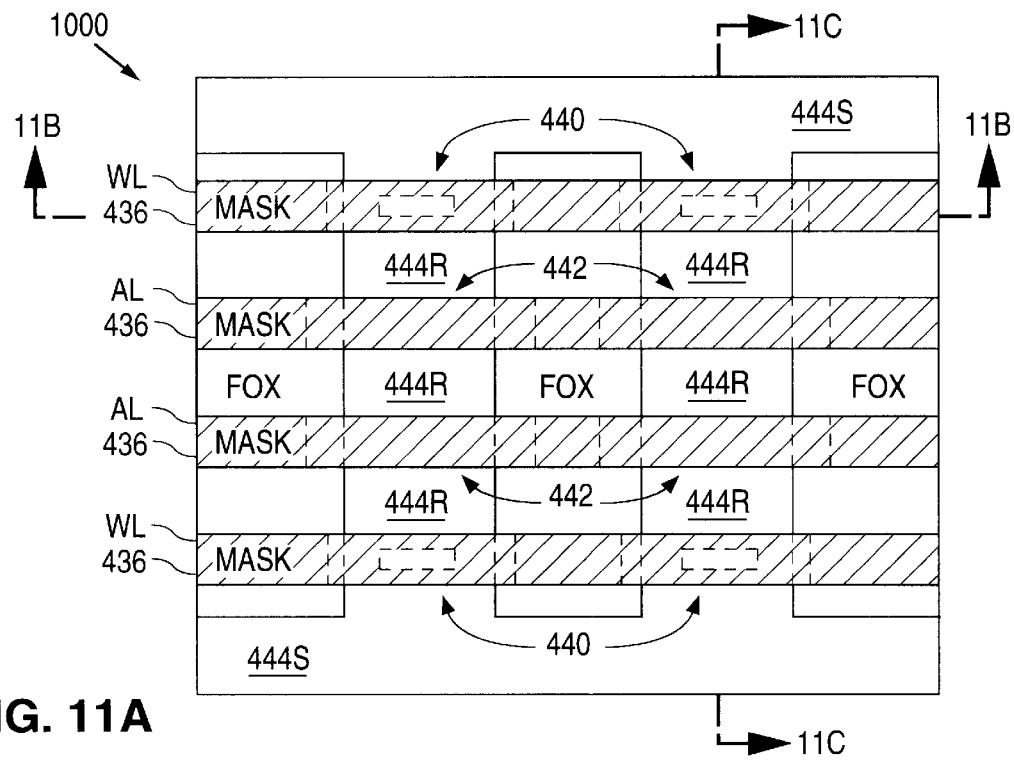
Figure 11B:
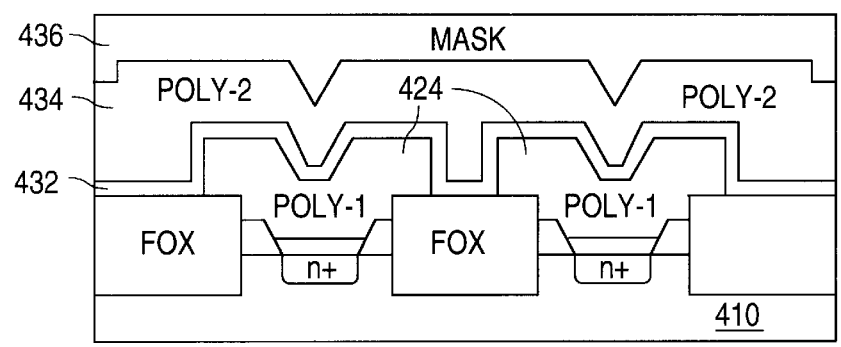
Figure 11C:
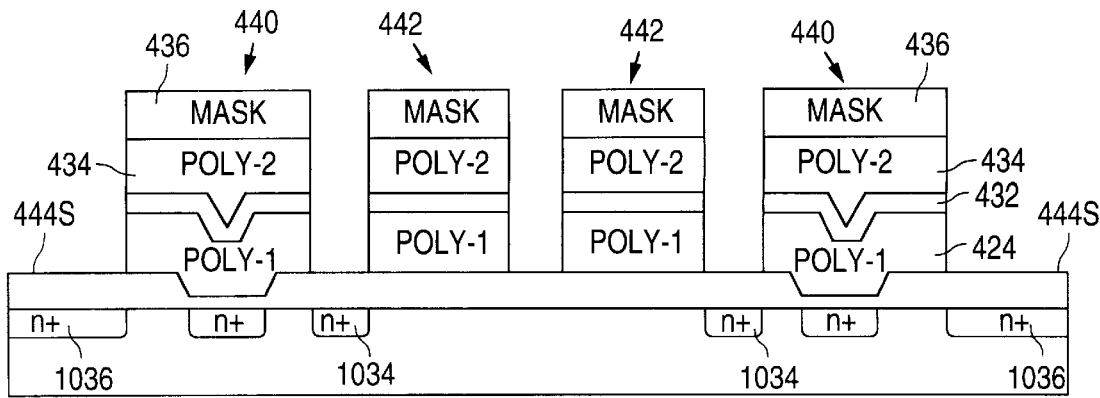

Next, as shown in FIGS. 11A–11C, interpoly dielectric layer 432 is formed on poly-1 and poly-2 regions 1030A and 1030B, the exposed regions 1032S and 1032R of oxide layer 412, and the field oxide regions FOX. Following this, poly-2 layer 434 is deposited on ONO layer 432. After poly-2 layer 434 has been formed, mask 436 is formed and patterned on poly-2 layer 434.

The unmasked regions of poly-2 layer 434, and the layer of ONO 432 and the poly-1 and poly-2 regions 1030A and 1030B formed under the unmasked regions of poly-2 layer 434 are then etched away to form structures 440 and 442, word and access lines WL and AL, and exposed strips and regions 444S and 444R on the surface of oxide layer 412. Exposed strips and regions 444S and 444R re-expose strips and regions 1032S and 1032R. Following the etch, mask 436 is removed.

Figure 12A:
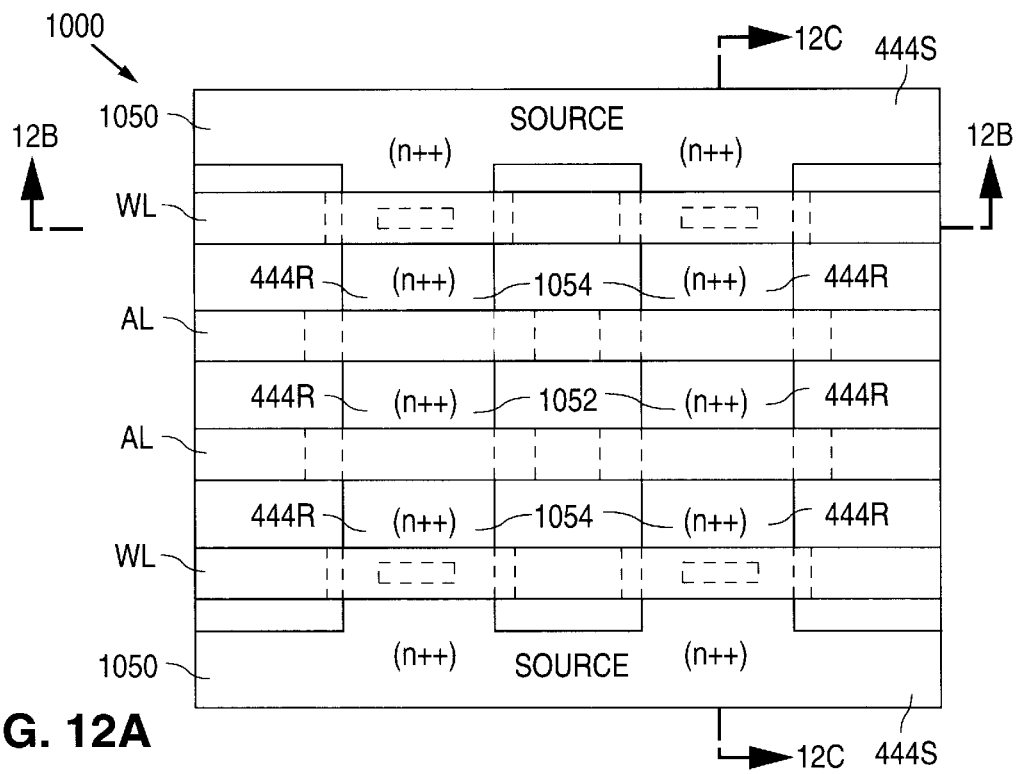
Figure 12B:
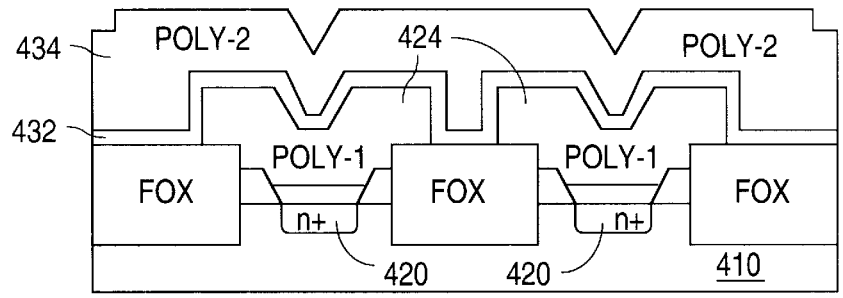
Figure 12C:
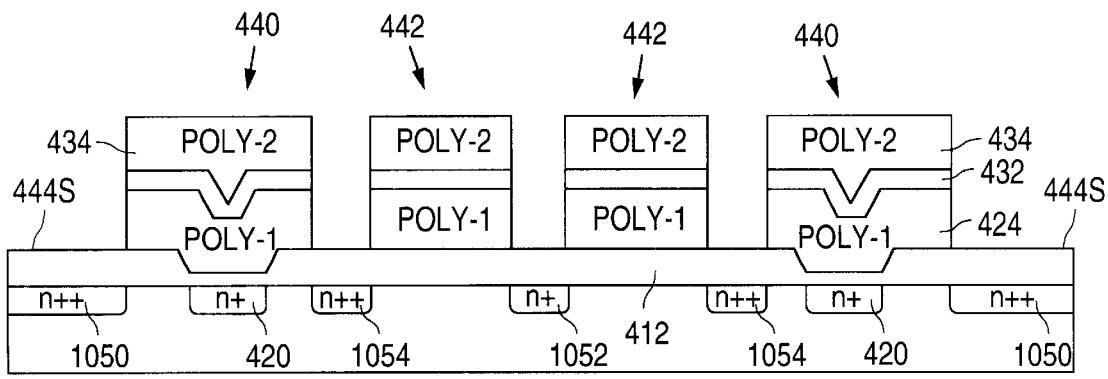

As shown in FIGS. 12A–12C, once mask 436 has been removed, the exposed strips and regions 444S and 444R are then implanted with an n-type dopant to form n++ source regions 1050, n+ drain regions 1052, and n++ buried regions 1054 in material 410. The implant also dopes the word and access lines WL and AL (including poly-2 control gates 448M and 448A).

Figure 13A:
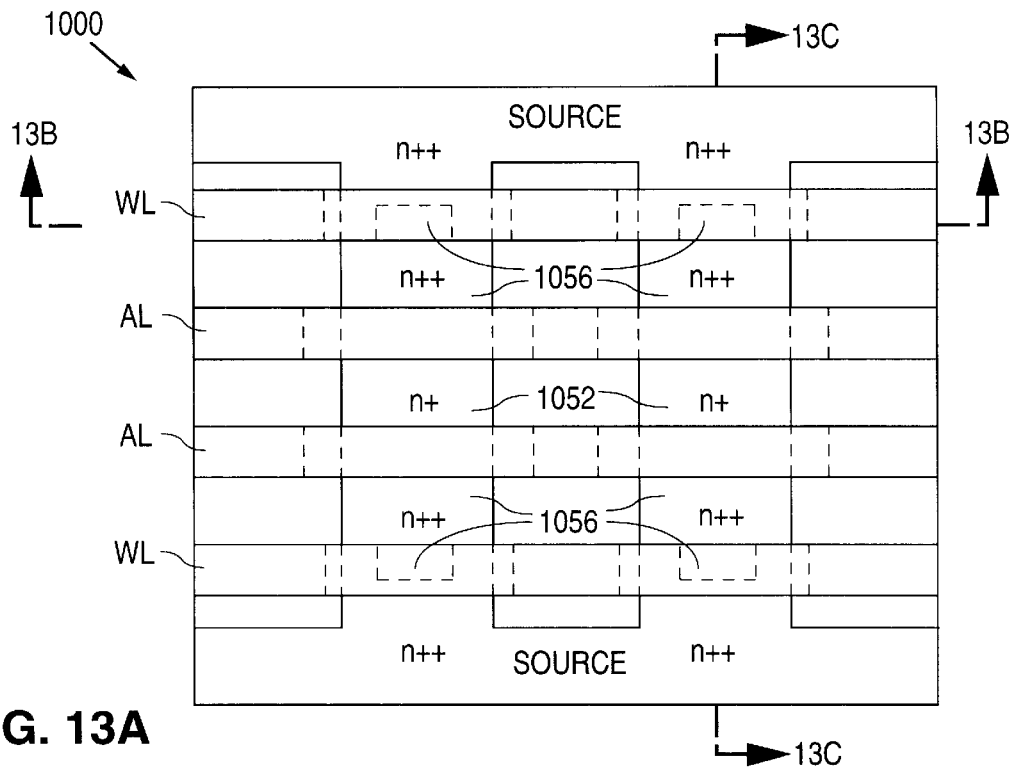
Figure 13B:
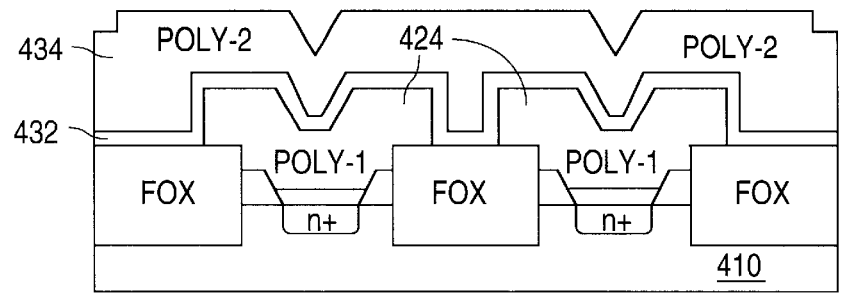
Figure 13C:
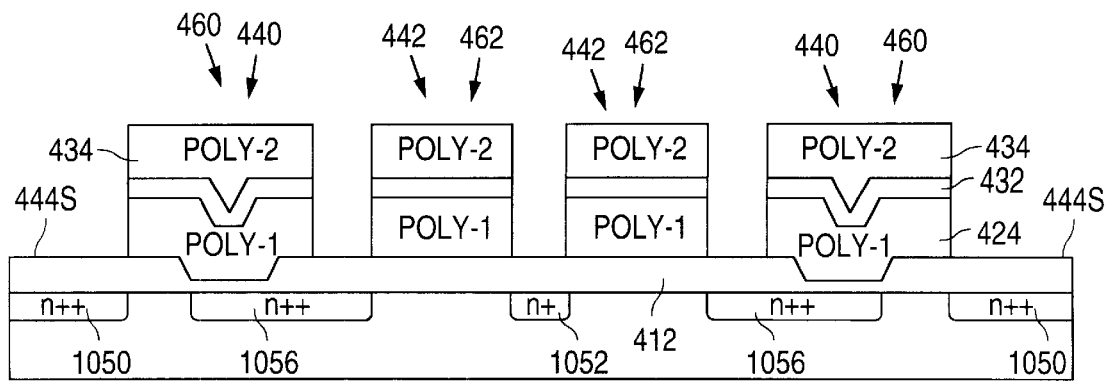

Next, as shown in FIGS. 13A–13C, the implants are driven in until the lateral diffusions of the adjoining pairs of n+ regions 420 and 1054 have overlapped each other by a sufficient amount to provide a single n+ region 1056. Conventional steps are then followed.

In a second alternate embodiment, the punchthrough voltages of access transistors 462 are increased by connecting the poly-2 control gates to the poly-1 floating gates of the access transistors. FIGS. 14A–19A show a series of plan views that illustrate a process flow for fabricating an EEPROM array 1400 in accordance with the second alternate embodiment of the present invention.

FIGS. 14B–19B show a series of cross-sectional views taken along lines 14B–19B, respectively, of FIGS. 14A–19A. FIGS. 14C–19C show a series of cross-sectional views taken along lines 14C–19C, respectively, of FIGS. 14A–19A.

Array 1400 is formed by a process that is similar to the process for forming array 1000 and, as a result, utilizes the same reference numerals to refer to the structures which are common to both processes.

Figure 14A:
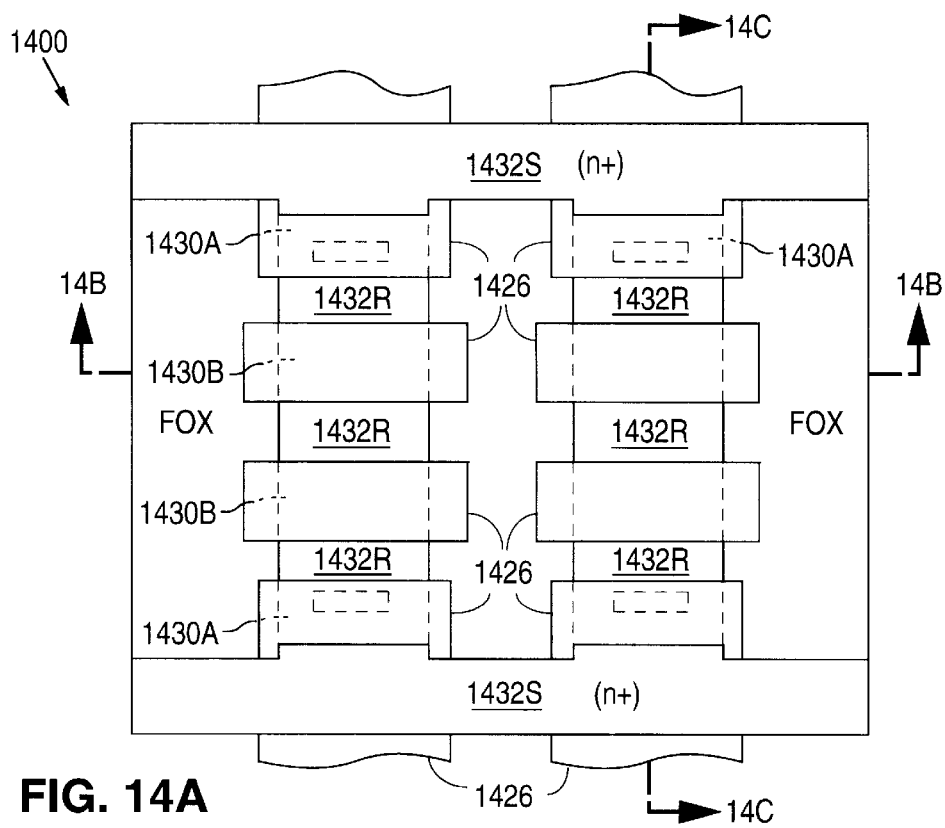
Figure 14B:
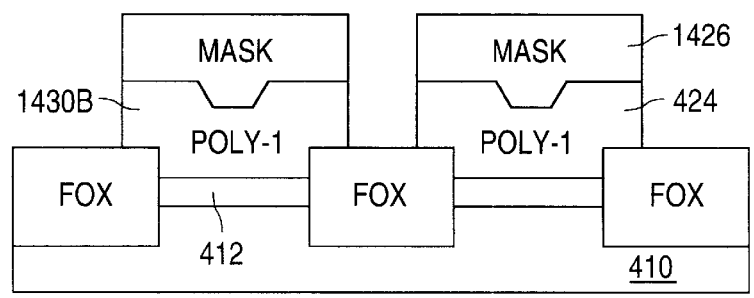
Figure 14C:
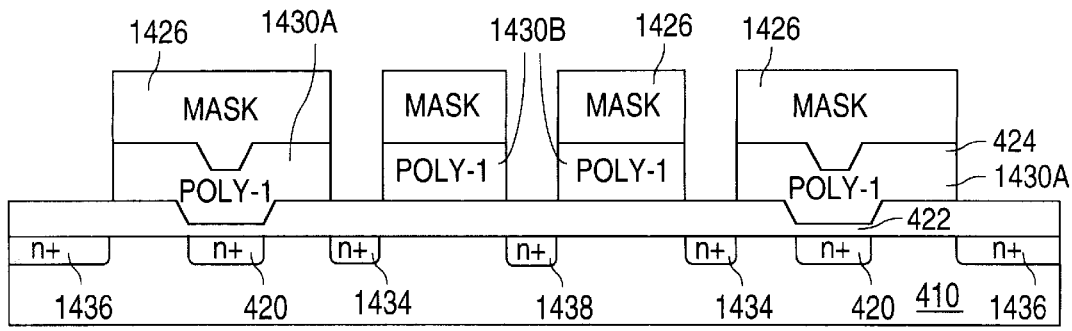

The process for forming array 1400 begins the same as the process for forming array 1000 and, as shown in FIGS. 14A–14C, first diverges by forming a mask 1426 on poly-1 layer 424 which is a modified version of mask 1026.

The unmasked areas of poly-1 layer 424 are then etched away to form rows and columns of first poly-1 regions 1430A and second poly-1 regions 1430B such that two second poly-1 regions 1430B are formed between every other adjacent pair of first poly-1 regions 1430A in each column of poly-1 and poly-2 regions 1430A and 1430B.

The etch additionally forms a plurality of exposed strips 1432S and a plurality of exposed regions 1432R on the surface of oxide layer 412. As shown, each exposed strip 1432S is formed along and between every other pair of adjacent rows of first poly-1 regions 1430A.

In addition, the plurality of exposed regions 1432R are formed so that an exposed region 1432R is formed between each adjacent pair of first and second poly-1 regions 1430A and 1430B, and each adjacent pair of second poly-1 regions 1430B in each column of poly-1 and poly-2 regions 1430A and 1430B. The exposed strips and regions 1432S and 1432R are then implanted with a n-type material to form initial buried regions 1434, initial source regions 1436, and initial drain region 1438. Once the implant has been completed, mask 1426 is removed.

Figure 15A:
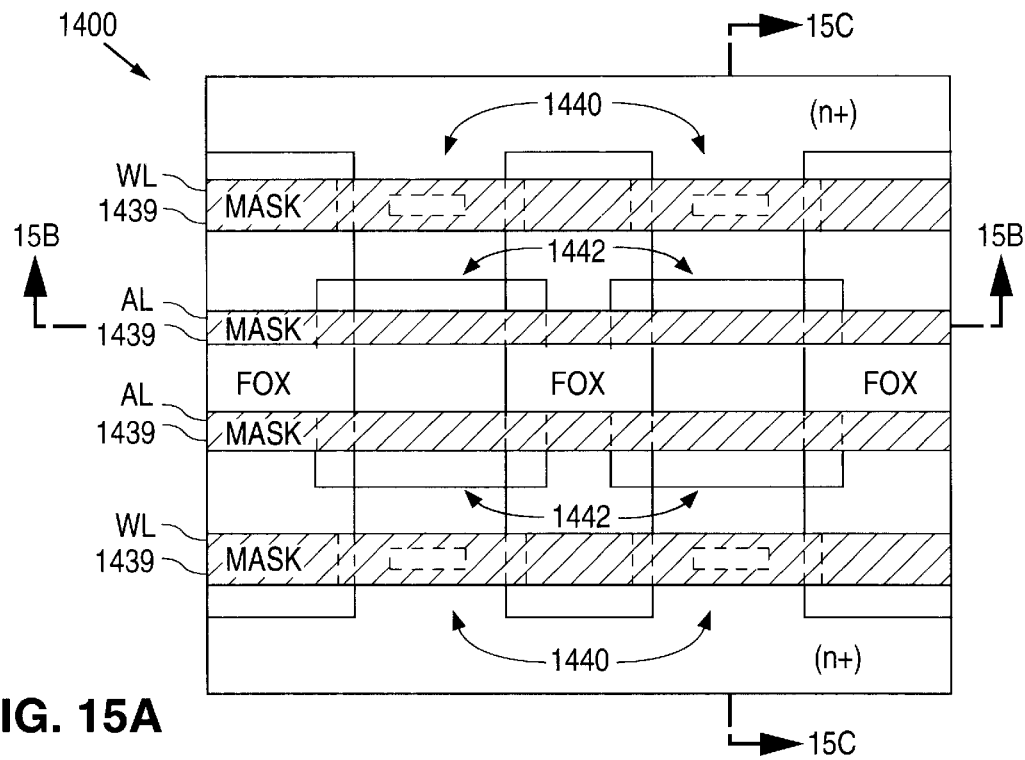
Figure 15B:
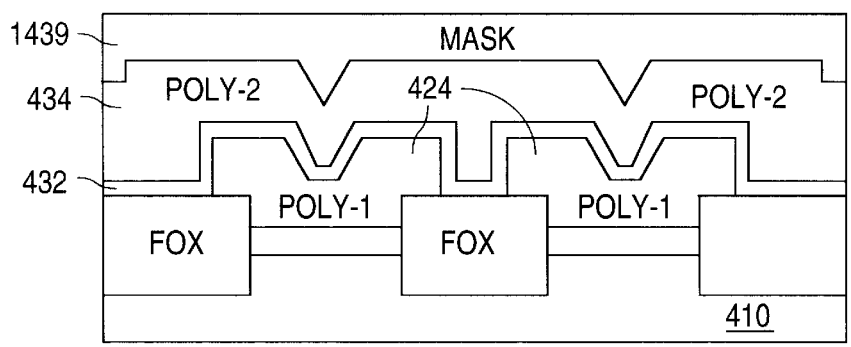
Figure 15C:
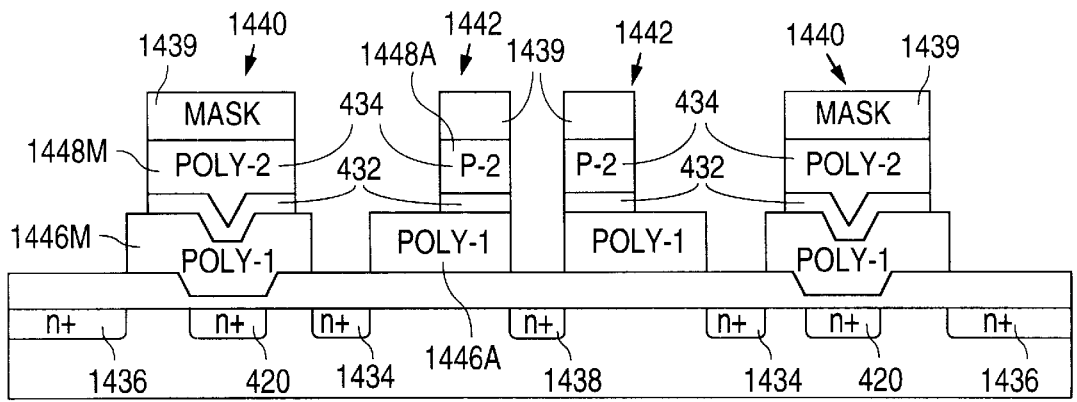

Next, as shown in FIGS. 15A–15C, interpoly dielectric layer 432 is formed on poly-1 regions 1430A and 1430B, the exposed regions of oxide layer 412, and the field oxide regions FOX. Following this, poly-2 layer 434 is deposited on ONO layer 432. After poly-2 layer 434 has been formed, a mask 1439 is formed and patterned on poly-2 layer 434.

The unmasked regions of poly-2 layer 434, and the layer of ONO 432 formed under the unmasked regions of poly-2 layer 434 are then etched away. The etch forms rows and columns of memory-transistor stacked-gate structures 1440 that each have a floating gate 1446M and a control gate 1448M, and a series of word lines WL that are formed so that each word line WL is connected to each control gate 1448M in a row of structures 1440.

The etch also forms rows and columns of access-transistor stacked-gate structures 1442 that each have a floating gate 1446A and a control gate 1448A, and a series of access lines AL that are formed so that each access line AL is connected to each control gate 1448A in a row of structures 1442. Thus, poly-1 layer 424 forms floating gates 1446M and 1446A in structures 1440 and 1442, respectively, while poly-2 layer 434 forms control gates 1448M and 1448A in structures 1440 and 1442, respectively.

Figure 16A:
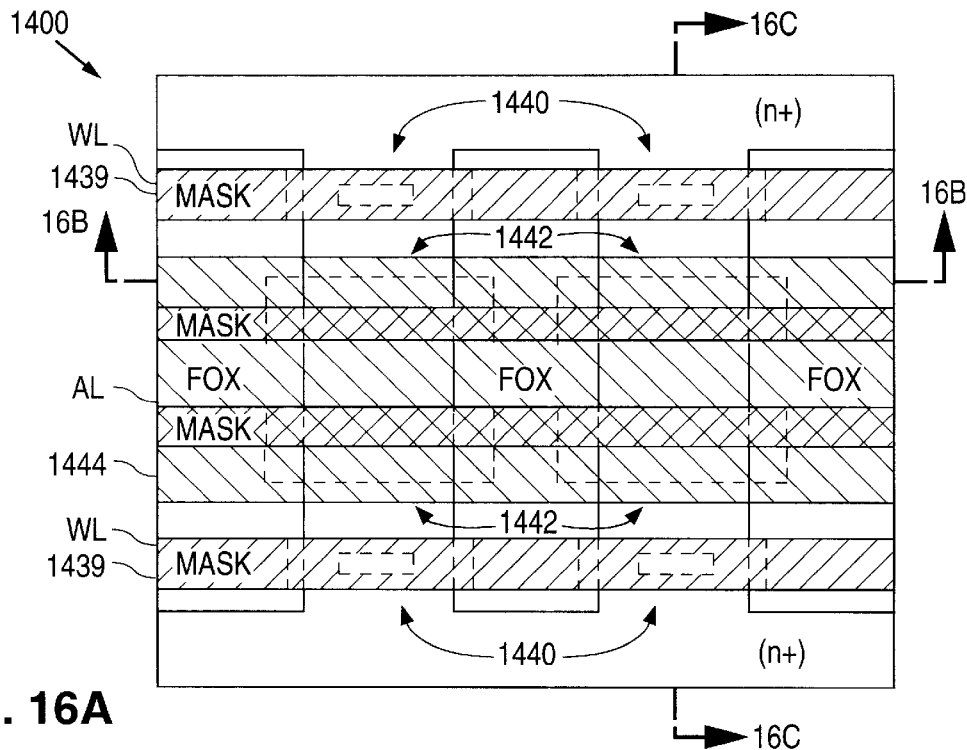
Figure 16B:
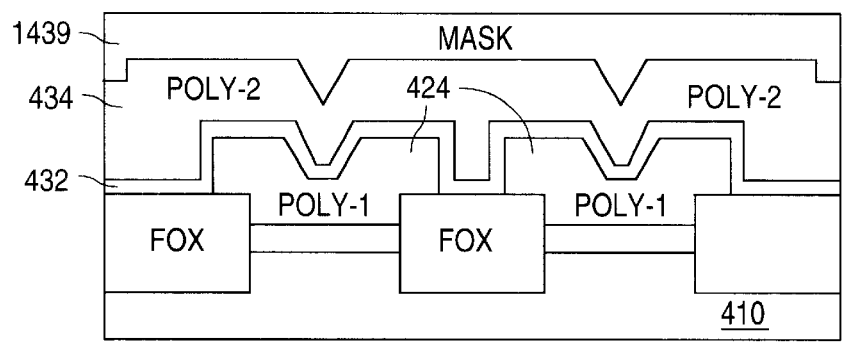
Figure 16C:
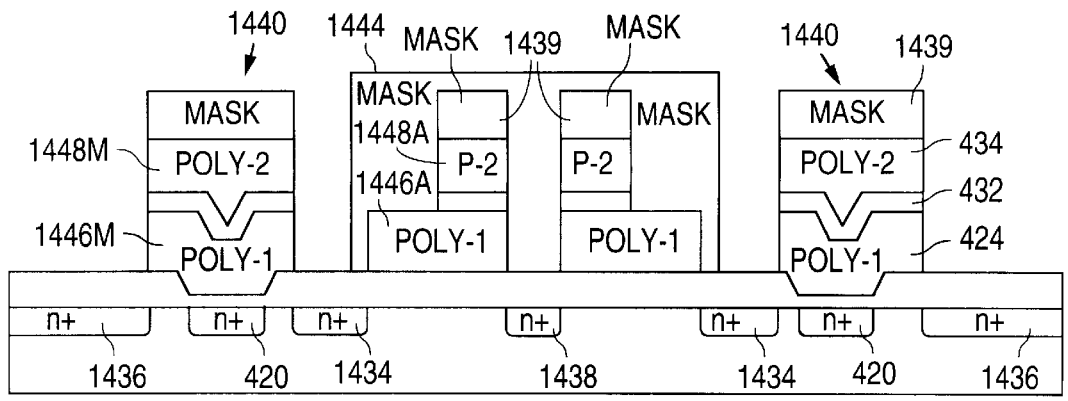

Next, as shown in FIGS. 16A–16C, a mask 1444 is formed and patterned to protect structures 1442. Following this, the exposed regions of poly-1 layer are etched away. Following the etch, masks 1439 and 1444 are removed.

Figure 17A:
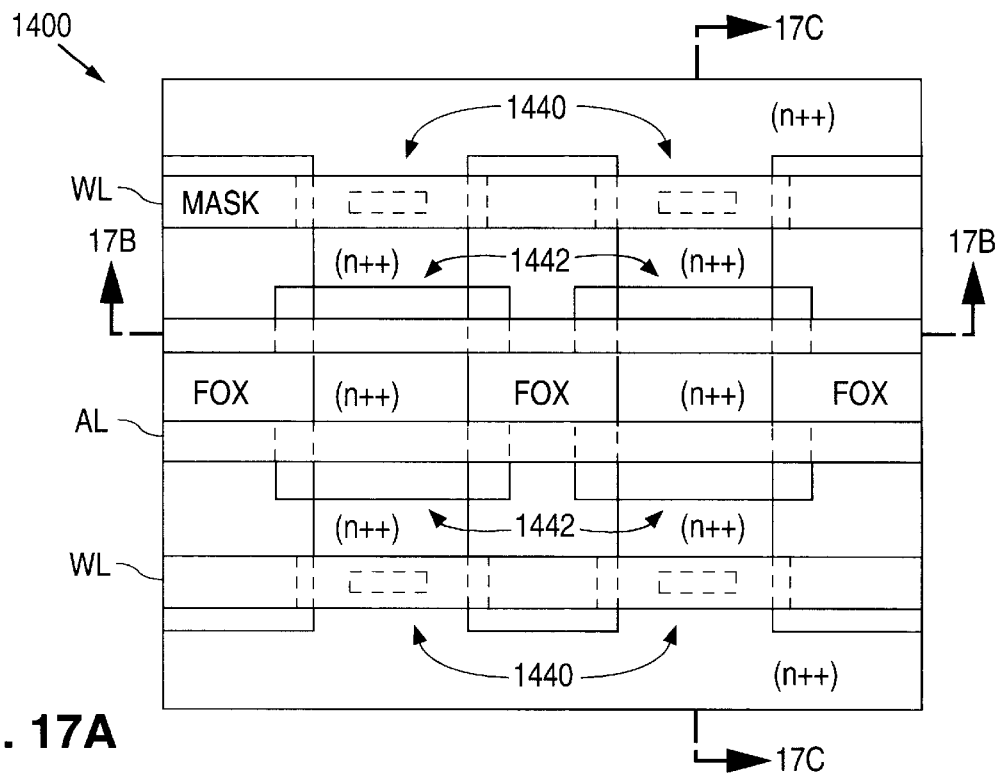
Figure 17B:
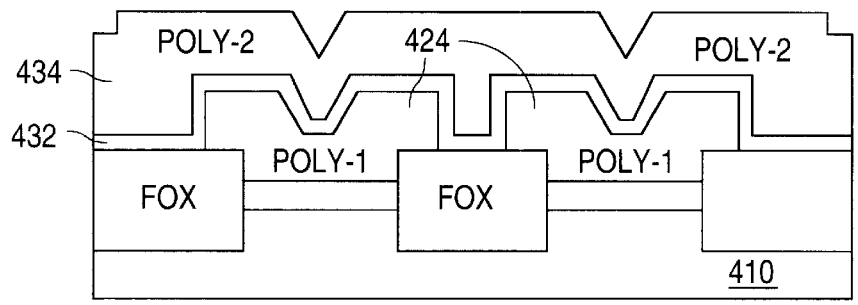
Figure 17C:
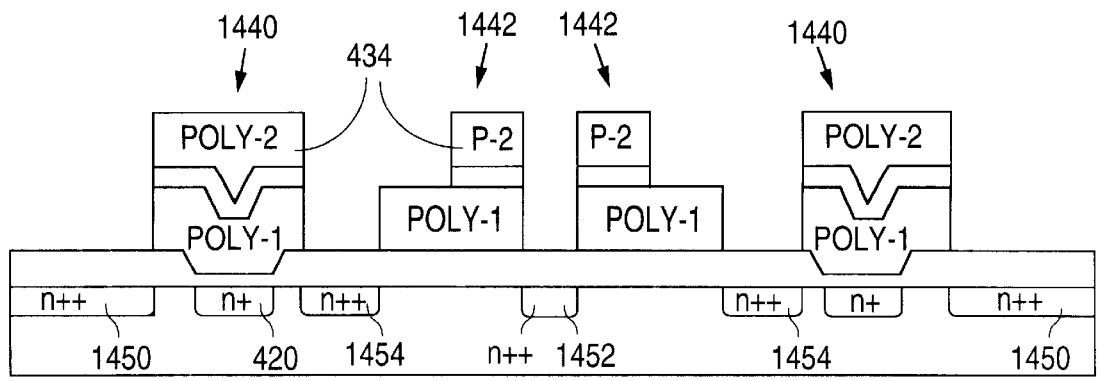

As shown in FIGS. 17A–17C, once masks 1439 and 1444 have been removed, the exposed regions of oxide layer 412 are then implanted with an n-type dopant to form n++ source regions 1450, n++ drain regions 1452, and n++ buried regions 1454 in material 410. The implant also dopes the poly-2 control gates 1448, and the word and access lines WL and AL.

Figure 18A:
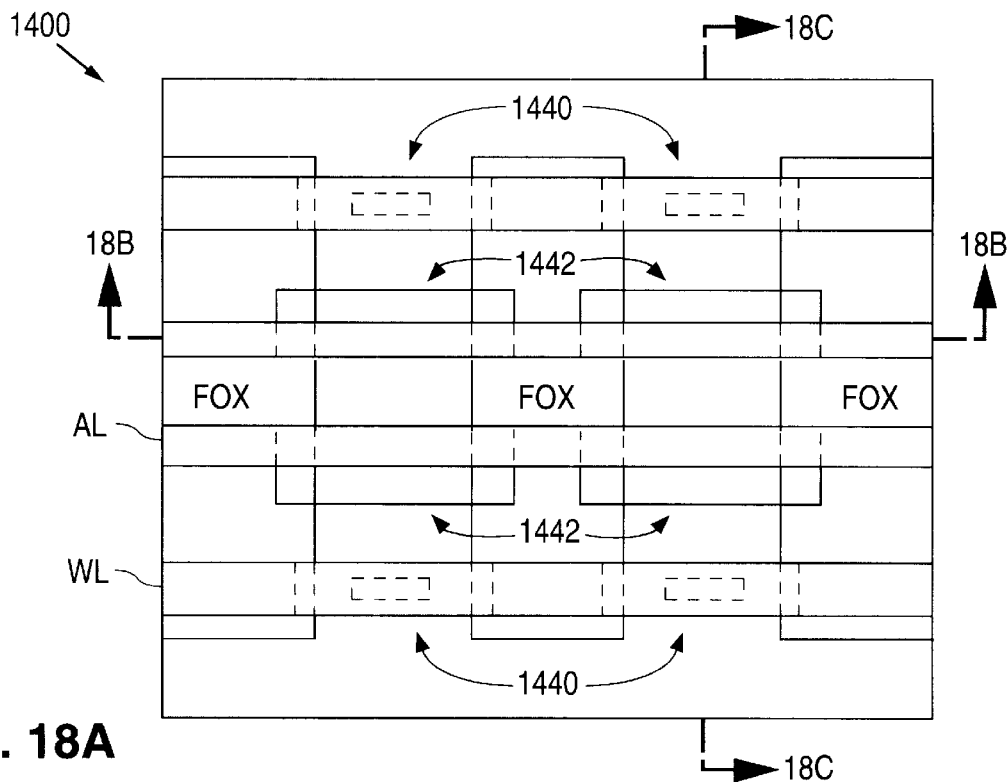
Figure 18B:
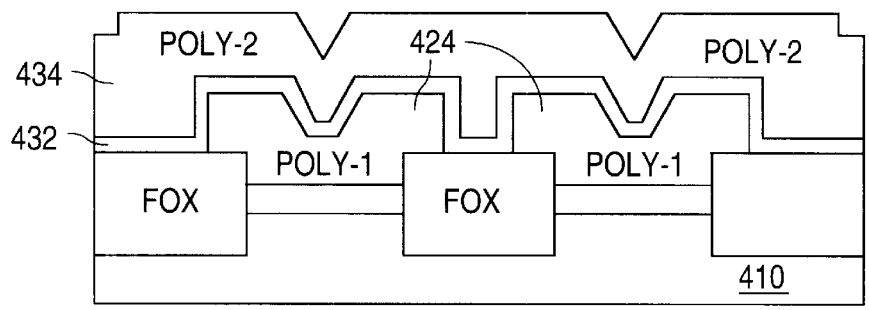
Figure 18C:
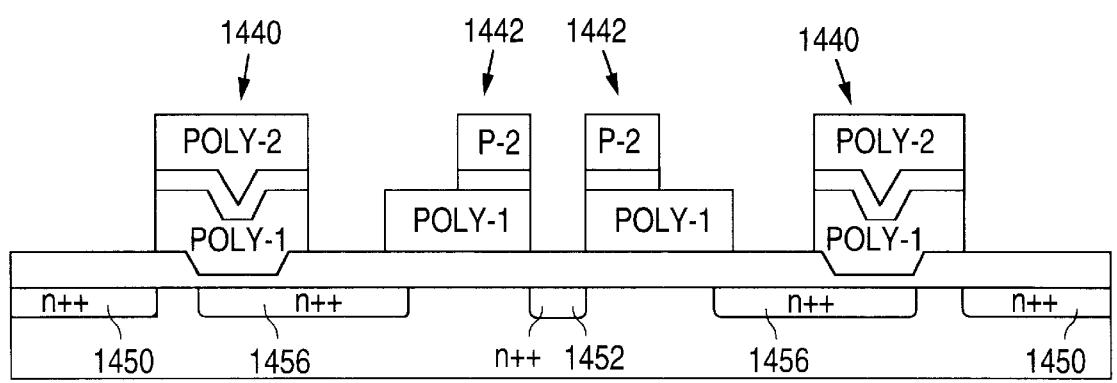

Next, as shown in FIGS. 18A–18C, the implants are driven in until the lateral diffusions of the adjoining pairs of n+ regions 420 and n++ region 1454 have overlapped each other by a sufficient amount to provide a single n+ (or n++) region 1456.

Figure 19C:
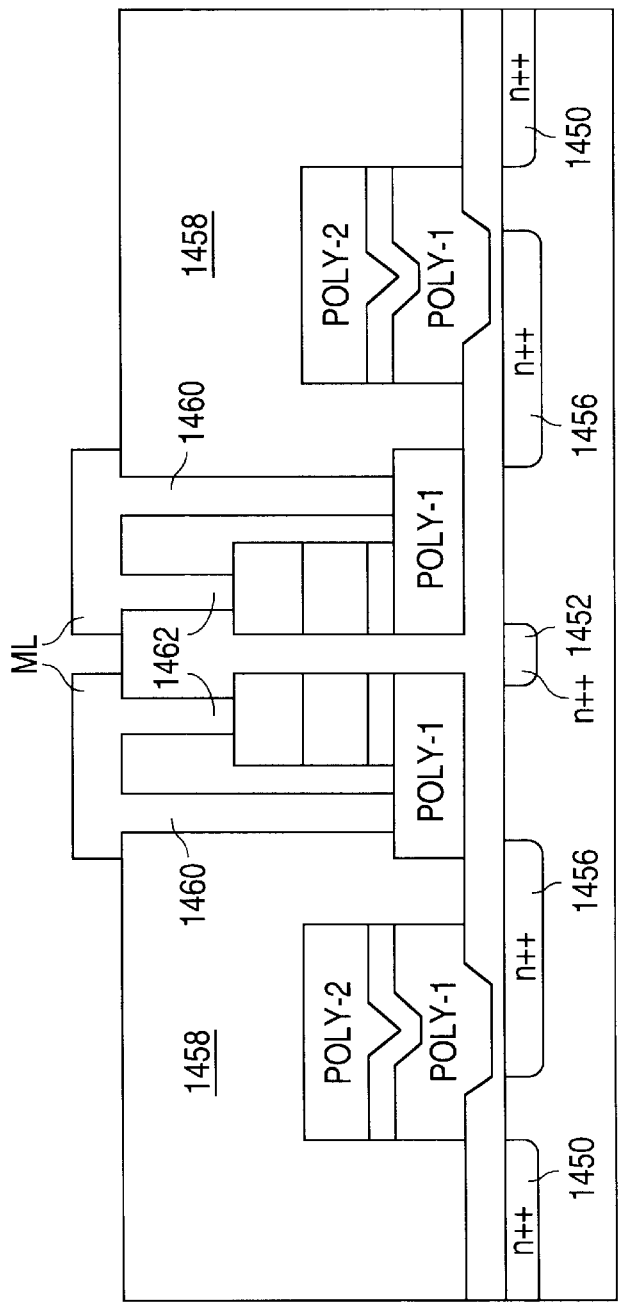
Figure 19A:
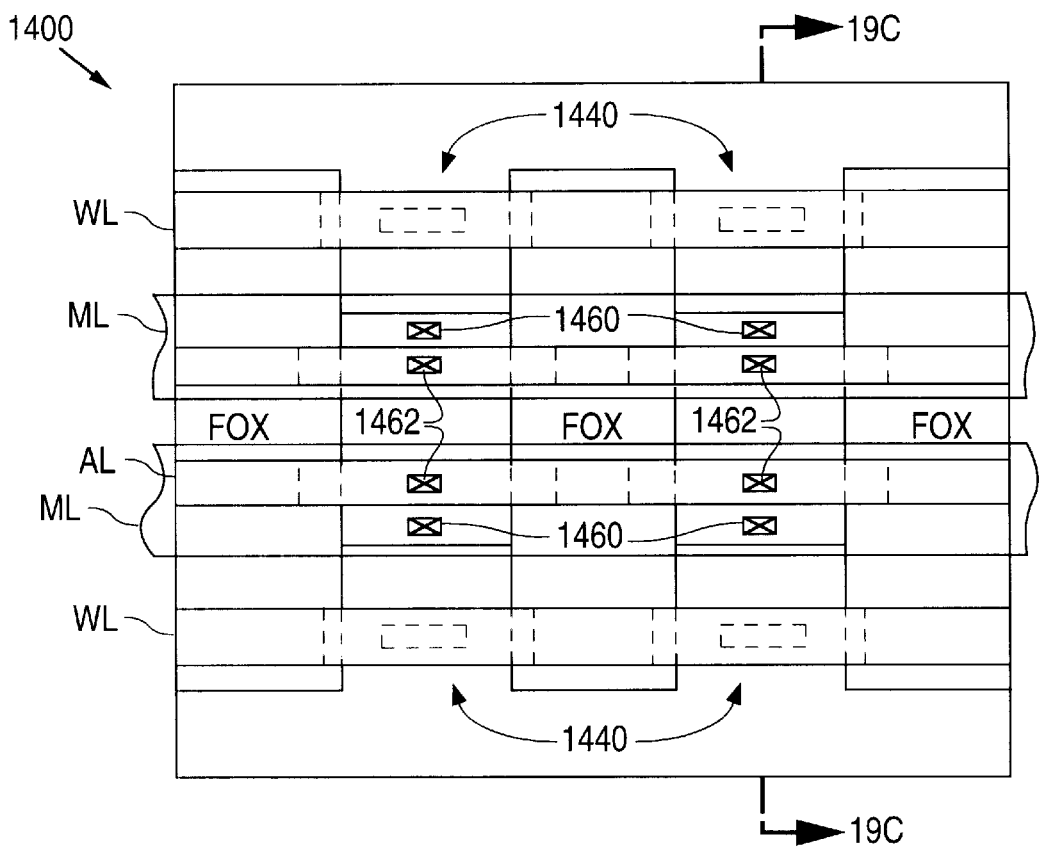
Figure 19B:
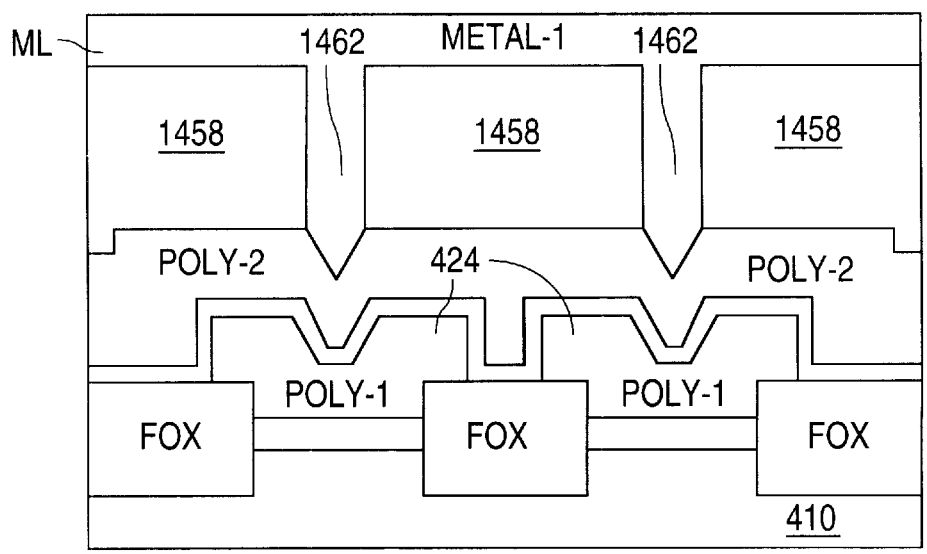

In accordance with the second alternate embodiment, as shown in FIGS. 19A–19C, a layer of insulation material 1458 is formed over the wafer. Contact openings are then formed in insulation layer 1458 to expose the poly-1 floating gate 1446A and the poly-2 control gate 1448A of each access transistor structure 1442.

A first layer of metal (metal-1) is then deposited on insulation layer 1458 to fill up the contact openings, thereby contacting the poly-1 floating gate 1446A and the poly-2 control gate 1448A of each access transistor structure 1442. The layer of metal-1 is then etched to form poly-1 metal contacts 1460, poly-2 metal contacts 1462, and rows of metal lines ML.

The rows of metal lines ML are connected to the metal contacts 1460 and 1462 so that each metal line ML is connected to all of the metal contacts 1460 and 1462 in a row of access transistor structures 1442. By forming metal contacts 1460 and 1462, higher voltages are required to punchthrough the access transistors.

A second layer of insulation material (not shown) is then formed on insulation layer 1458 and the metal lines ML. Contact openings are then formed in the second layer of insulation material to expose the drain regions 1452. A second layer of metal (not shown) is then deposited on the second insulation layer to fill up the contact openings, thereby contacting the drain regions 1452. The second layer of metal is then etched to form drain metal contacts, and columns of metal lines. Conventional steps are then followed to complete the process.

Arrays 400, 1000, and 1400 are read, programmed, and erased as described in U.S. Pat. No. 5,856,222 to Bergemont et al. which is hereby incorporated by reference.

Thus, the present invention provides a method for forming an EEPROM array which eliminates the problem of stopping an etch on a layer of thin tunnel oxide, and increases the punchthrough voltage of the access transistors.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of forming an EEPROM cell in a semiconductor material of a first conductivity type, the semiconductor material having a surface, the method comprising the steps of:

forming a layer of isolation material on the semiconductor material, the layer of isolation material having a first thickness;

forming a mask on the layer of isolation material that defines a first area on the surface of the semiconductor material;

removing the layer of isolation material formed over the first area to form an exposed area on the surface of the semiconductor material;

introducing a dopant of a second conductivity type through the first area to form a first region in the semiconductor material;

forming a layer of tunnel oxide on the exposed area, the layer of tunnel oxide having a second thickness that is less than the first thickness;

forming a first layer of polysilicon (poly-1) on the layer of isolation material and the layer of tunnel oxide;

selectively etching the layer of poly-1 to form a poly-1 region on the surface of the layer of isolation material, the poly-1 region being formed over the first region;

forming a layer of dielectric material on the poly-1 region;

forming a second layer of polysilicon (poly-2) on the layer of dielectric material; and selectively removing the poly-2 layer, and underlying layers of dielectric material and the poly-1 layer to form a memory-transistor stacked-gate structure and an access-transistor stacked-gate structure, and to expose a first implant area on the layer of isolation material between the memory transistor stacked-gate structure and the access transistor stacked-gate structure, a second implant area on the layer of isolation material that is spaced apart from the first implant area and adjacent to the memory-transistor stacked-gate structure, and a third implant area on the layer of isolation material that is spaced apart from the first and second implant areas and adjacent to the access-transistor stacked-gate structure.

2. The method of claim 1 and further comprising the step of introducing a dopant of the second conductivity type into the semiconductor material through the first, second, and third implant areas to form a second region between the memory-transistor stacked-gate structure and the access-transistor stacked-gate structure, a source region adjacent to the memory-transistor stacked-gate structure, and a drain region adjacent to the access-transistor stacked-gate structure.

3. The method of claim 2 and further comprising the step of driving in the dopants to laterally diffuse the dopants so that the first and second regions contact each other.

4. The method of claim 1 wherein the first thickness is about 300 Å.

5. The method of claim 1 wherein the second thickness is about 70 Å.

6. The method as in claim 1 and wherein the dielectric material is oxide\nitride\oxide (ONO).

7. A method of forming a plurality of EEPROM cells in a semiconductor material of a first conductivity type, the semiconductor material having a surface, the method comprising the steps of:

forming a layer of isolation material on the semiconductor material, the layer of isolation material having a first thickness;

forming a mask that defines a plurality of first areas on the surface of the semiconductor material;

removing the layer of isolation material formed over the first areas to form a plurality of exposed areas on the surface of the semiconductor material;

introducing a dopant of a second conductivity type through the first areas to form a plurality of first regions in the semiconductor material, the first regions being arranged in rows and columns;

forming a layer of tunnel oxide on each of the exposed areas, the layer of tunnel oxide having a second thickness that is less than the first thickness;

forming a first layer of polysilicon (poly-1) on the layer of isolation material and the layer of tunnel oxide formed on each of the exposed areas;

selectively etching the layer of poly-1 to form a plurality of poly-1 strips on the surface of the layer of isolation material, each poly-1 strip being formed over a column of first regions;

forming a layer of dielectric material on the poly-1 strips;

forming a second layer of polysilicon (poly-2) on the layer of dielectric material; and selectively removing the poly-2 layer, and the underlying layer of dielectric material, and poly-1 strips to form:

rows and columns of memory-transistor stacked-gate structures that are each formed over a first region, and have a floating gate and a control gate, a plurality of word lines that are formed so that each word line is connected to each control gate in a row of structures, rows and columns of access-transistor stacked-gate structures that each have a floating gate and a control gate, the access-transistor stacked-gate structures being formed in a same column as the memory-transistor stacked-gate structures, a plurality of access lines that are formed so that each access line is connected to each control gate of each access-transistor stacked-gate structure in a row of access-transistor stacked-gate structures, and a plurality of exposed strips and a plurality of exposed regions on the surface of the layer of isolation material, each exposed strip being substantially parallel to the word and access lines and formed along and between a pair of adjacent rows of memory-transistor stacked-gate structures, the exposed regions being formed so that an exposed region is formed between each adjacent pair of access-transistor stacked-gate structures in each column of access structures, and between each memory-transistor stacked-gate structure and each access-transistor stacked-gate structure in each column of memory and access structures.

8. The method of claim 7 and further comprising the step of introducing a dopant of the second conductivity type into the semiconductor material through the exposed strips and regions to form a second region between each memory-transistor stacked-gate structure and an adjacent access-transistor stacked-gate structure, a source region between adjacent rows of memory-transistor stacked-gate structures, and a drain region between each pair of adjacent access-transistors in a column of structure.

9. The method of claim 8 and further comprising the step of driving in the dopants to laterally diffuse the dopants so that each first region is contacted by an adjacent second region.

10. A method of forming a plurality of EEPROM cells in a semiconductor material of a first conductivity type, the semiconductor material having a surface, the method comprising the steps of:

forming a layer of isolation material on the semiconductor material, the layer of isolation material having a first thickness;

forming a mask that defines a plurality of first areas on the surface of the semiconductor material;

removing the layer of isolation material formed over the first areas to form a plurality of exposed areas on the surface of the semiconductor material;

introducing a dopant of a second conductivity type through the first areas to form a plurality of first regions in the semiconductor material, the first regions being arranged in rows and columns;

forming a layer of tunnel oxide on each of the exposed areas, the layer of tunnel oxide having a second thickness that is less than the first thickness;

forming a first layer of polysilicon (poly-1) on the layer of isolation material and the layer of tunnel oxide formed on each of the exposed areas; and selectively etching the layer of poly-1 to form:

rows and columns of first and second poly-1 regions such that a second poly-1 region is formed between every other pair of first poly-1 regions in each column of poly-1 and poly-2 regions, and a plurality of first exposed strips and a plurality of first exposed regions on the surface of the layer of isolation material, each first exposed strip being formed along and between every other pair of adjacent rows of first poly-1 regions, the plurality of first exposed regions being formed so that a first exposed region is formed between each adjacent pair of first and second poly-1 regions in each column of first and second poly-1 regions;

introducing a dopant of a second conductivity type into the first exposed strips and first exposed regions to form initial second regions and initial source regions;

forming a layer of dielectric material on the first and second poly-1 regions;

forming a second layer of polysilicon (poly-2) on the layer of dielectric material; and selectively removing the poly-2 layer, and the underlying layer of dielectric material, and first and second poly-1 regions to form:
  rows and columns of memory-transistor stacked-gate structures that are each formed over a first region, and have a floating gate and a control gate,
  a plurality of word lines that are formed so that each word line is connected to each control gate in a row of structures,
  rows and columns of access-transistor stacked-gate structures that each have a floating gate and a control gate, the access-transistor stacked-gate structures being formed in a same column as the memory-transistor stacked-gate structures,
  a plurality of access lines that are formed so that each access line is connected to each control gate of each access-transistor stacked-gate structure in a row of access-transistor stacked-gate structures, and
  a plurality of second exposed strips and a plurality of second exposed regions on the surface of the layer of isolation material, each second exposed strip being substantially parallel to the word and access lines and formed along and between a pair of adjacent rows of memory-transistor stacked-gate structures, the second exposed regions being formed so that an second exposed region is formed between each adjacent pair of access-transistor stacked-gate structures in each column of access structures, and between each memory-transistor stacked-gate structure and each access-transistor stacked-gate structure in each column of memory and access structures.

11. The method of claim 10 and further comprising the step of introducing a dopant of the second conductivity type into the semiconductor material through the second exposed strips and regions to form a second region between each memory-transistor stacked-gate structure and an adjacent access-transistor stacked-gate structure, a source region between adjacent rows of memory-transistor stacked-gate structures, and a drain region between each pair of adjacent access-transistors in a column of structure.

12. The method of claim 11 and further comprising the step of driving in the dopants to laterally diffuse the dopants so that each first region is contacted by an adjacent second region.

13. A method of forming a plurality of EEPROM cells in a semiconductor material of a first conductivity type, the semiconductor material having a surface, the method comprising the steps of:
  forming a layer of isolation material on the semiconductor material, the layer of isolation material having a first thickness;
  forming a mask that defines a plurality of first areas on the surface of the semiconductor material;
  removing the layer of isolation material formed over the first areas to form a plurality of exposed areas on the surface of the semiconductor material;
  introducing a dopant of a second conductivity type through the first areas to form a plurality of first regions in the semiconductor material, the first regions being arranged in rows and columns;
  forming a layer of tunnel oxide on each of the exposed areas, the layer of tunnel oxide having a second thickness that is less than the first thickness;
  forming a first layer of polysilicon (poly-1) on the layer of isolation material and the layer of tunnel oxide formed on each of the exposed areas; and
  selectively etching the layer of poly-1 to form:
    rows and columns of first poly-1 regions and second poly-1 regions such that two second poly-1 regions are formed between every other adjacent pair of first poly-1 regions in each column of poly-1 and poly-2 regions, and
    a plurality of first exposed strips and a plurality of first exposed regions on the surface of the layer of isolation material, each first exposed strip being formed along and between every other pair of adjacent rows of first poly-1 regions, the plurality of first exposed regions being formed so that a first exposed region is formed between each adjacent pair of first and second poly-1 regions, and each adjacent pair of second poly-1 regions in each column of poly-1 and poly-2 regions;
  introducing a dopant of a second conductivity type into the first exposed strips and regions to form initial second regions, initial drain regions, and initial source regions;
  forming a layer of dielectric material on the first and second poly-1 regions;
  forming a second layer of polysilicon (poly-2) on the layer of dielectric material; and
  selectively removing the poly-2 layer, and the underlying layer of dielectric material to form:
    rows and columns of memory-transistor stacked-gate structures that are each formed over a first region, and have a floating gate and a control gate,
    a plurality of word lines that are formed so that each word line is connected to each control gate in a row of structures,
    rows and columns of access-transistor stacked-gate structures that each have a floating gate and a control gate, the access-transistor stacked-gate structures being formed in a same column as the memory-transistor stacked-gate structures, and
    a plurality of access lines that are formed so that each access line is connected to each control gate of each access-transistor stacked-gate structure in a row of access-transistor stacked-gate structures, and
    a plurality of second exposed strips and a plurality of second exposed regions on the surface of the layer of isolation material, each second exposed strip being substantially parallel to the word and access lines and formed along and between a pair of adjacent rows of memory-transistor stacked-gate structures, the second exposed regions being formed so that an second exposed region is formed between each adjacent pair of access-transistor stacked-gate structures in each column of access structures, and between each memory-transistor stacked-gate structure and each access-transistor stacked-gate structure in each column of memory and access structures.

14. The method of claim 13 and further comprising the step of introducing a dopant of the second conductivity type into the semiconductor material through the second exposed strips and regions to form a second region between each memory-transistor stacked-gate structure and an adjacent access-transistor stacked-gate structure, a source region between adjacent rows of memory-transistor stacked-gate structures, and a drain region between each pair of adjacent access-transistors in a column of structure.

15. The method of claim 14 and further comprising the step of driving in the dopants to laterally diffuse the dopants so that each first region is contacted by an adjacent second region.

* * * * *